US009337231B2

(12) United States Patent
Narui

(10) Patent No.: US 9,337,231 B2
(45) Date of Patent: May 10, 2016

(54) SOLID STATE IMAGE SENSOR WITH PLURAL OVERLAPPING PHOTOELECTRIC CONVERSION UNITS

(75) Inventor: Tadashi Narui, Sagamihara (JP)

(73) Assignee: NIKON CORPORATION, Tokyo (JP)

(*) Notice: Subject to any disclaimer, the term of this patent is extended or adjusted under 35 U.S.C. 154(b) by 894 days.

(21) Appl. No.: 12/852,155

(22) Filed: Aug. 6, 2010

(65) Prior Publication Data

US 2011/0068251 A1 Mar. 24, 2011

(30) Foreign Application Priority Data

Aug. 8, 2009 (JP) .................................. 2009-185343
Aug. 3, 2010 (JP) .................................. 2010-174881

(51) Int. Cl.
| H01L 27/00 | (2006.01) |
| G01J 1/44 | (2006.01) |
| H01L 27/146 | (2006.01) |
| H04N 9/04 | (2006.01) |

(52) U.S. Cl.
CPC .... *H01L 27/14647* (2013.01); *H01L 27/14641* (2013.01); *H04N 9/045* (2013.01); *H01L 27/14621* (2013.01); *H01L 27/14627* (2013.01)

(58) Field of Classification Search
USPC ............ 250/208.1, 214 R, 214.1, 226, 214 A, 250/216; 348/266, 268, 270–283, 300–302, 348/336; 257/414, 431, 432, 434, 440, 443; 356/402, 416, 419
See application file for complete search history.

(56) References Cited

U.S. PATENT DOCUMENTS

| 5,063,439 A | 11/1991 | Tabei |
| 5,471,515 A | 11/1995 | Fossum et al. |
| 5,793,322 A | 8/1998 | Fossum et al. |
| 5,841,126 A | 11/1998 | Fossum et al. |
| 5,880,691 A | 3/1999 | Fossum et al. |
| 5,886,659 A | 3/1999 | Pain et al. |
| 5,887,049 A | 3/1999 | Fossum |
| 5,909,026 A | 6/1999 | Zhou et al. |
| 5,929,800 A | 7/1999 | Zhou et al. |

(Continued)

FOREIGN PATENT DOCUMENTS

| JP | A-03-174890 | 7/1991 |
| JP | A-10-189930 | 7/1998 |

(Continued)

OTHER PUBLICATIONS

Office Action issued in European Patent Application No. 03 778 803.1, on Aug. 18, 2010.

(Continued)

*Primary Examiner* — Pascal M Bui Pho
(74) *Attorney, Agent, or Firm* — Oliff PLC

(57) ABSTRACT

A solid-state image sensor includes: four or more photoelectric conversion units having spectral sensitivity characteristics different from one another; an amplifier unit disposed in correspondence to each group of photoelectric conversion units among N groups (N represents an integer less than a quantity of the four or more photoelectric conversion units and equal to or greater than one), the four or more photoelectric conversion units being divided into the N groups; and transfer units, each disposed in correspondence to one of the four or more photoelectric conversion units, which transfer a signal generated at the photoelectric conversion unit to the amplifier unit disposed for the group to which the photoelectric conversion unit belongs.

10 Claims, 13 Drawing Sheets

(56) References Cited

U.S. PATENT DOCUMENTS

| | | | |
|---|---|---|---|
| 5,949,483 A | 9/1999 | Fossum et al. | |
| 5,952,645 A | 9/1999 | Wang et al. | |
| 5,990,506 A | 11/1999 | Fossum et al. | |
| 6,021,172 A | 2/2000 | Fossum et al. | |
| 6,057,539 A | 5/2000 | Zhou et al. | |
| 6,101,232 A | 8/2000 | Fossum et al. | |
| 6,107,618 A | 8/2000 | Fossum et al. | |
| 6,107,619 A | 8/2000 | Cunningham et al. | |
| 6,115,065 A | 9/2000 | Yadid-Pecht et al. | |
| 6,124,819 A | 9/2000 | Zhou et al. | |
| 6,166,768 A | 12/2000 | Fossum et al. | |
| 6,175,383 B1 | 1/2001 | Yadid-Pecht et al. | |
| 6,326,230 B1 | 12/2001 | Pain et al. | |
| 6,346,700 B1 | 2/2002 | Cunningham et al. | |
| 6,373,050 B1 | 4/2002 | Pain et al. | |
| 6,380,572 B1 | 4/2002 | Pain et al. | |
| 6,384,413 B1 | 5/2002 | Pain | |
| 6,400,824 B1 | 6/2002 | Mansoorian et al. | |
| 6,403,963 B1 | 6/2002 | Nikzad et al. | |
| 6,456,326 B2 | 9/2002 | Fossum et al. | |
| 6,476,860 B1 | 11/2002 | Yadid-Pecht et al. | |
| 6,486,503 B1 | 11/2002 | Fossum | |
| 6,515,702 B1 | 2/2003 | Yadid-Pecht et al. | |
| 6,519,371 B1 | 2/2003 | Pain et al. | |
| 6,546,148 B1 | 4/2003 | Yadid-Pecht et al. | |
| 6,549,235 B1 | 4/2003 | Fossum et al. | |
| 6,555,842 B1 | 4/2003 | Fossum et al. | |
| 6,570,617 B2 | 5/2003 | Fossum et al. | |
| 6,606,122 B1 | 8/2003 | Shaw et al. | |
| 6,665,013 B1 | 12/2003 | Fossum et al. | |
| 6,721,464 B2 | 4/2004 | Pain et al. | |
| 6,744,068 B2 | 6/2004 | Fossum et al. | |
| 6,787,749 B1 | 9/2004 | Zhou et al. | |
| 6,801,258 B1 | 10/2004 | Pain et al. | |
| 6,825,059 B2 | 11/2004 | Fossum | |
| 6,838,301 B2 | 1/2005 | Zheng et al. | |
| 6,839,452 B1 | 1/2005 | Yang et al. | |
| 6,841,816 B2 * | 1/2005 | Merrill et al. | 257/294 |
| 6,888,568 B1 * | 5/2005 | Neter | 348/222.1 |
| 6,933,488 B2 | 8/2005 | Pain | |
| 6,943,838 B2 | 9/2005 | Fossum et al. | |
| 6,944,352 B1 | 9/2005 | Yadid-Pecht et al. | |
| 6,980,230 B2 | 12/2005 | Yadid-Pecht et al. | |
| 7,002,626 B2 | 2/2006 | Pain et al. | |
| 7,019,345 B2 | 3/2006 | Pain et al. | |
| 7,053,929 B2 | 5/2006 | Yadid-Pecht et al. | |
| 7,105,371 B2 | 9/2006 | Fossum et al. | |
| 7,154,157 B2 * | 12/2006 | Bradski et al. | 257/440 |
| 7,190,398 B1 | 3/2007 | Yadid-Pecht et al. | |
| 7,268,814 B1 | 9/2007 | Pain et al. | |
| 7,369,166 B2 | 5/2008 | Fossum et al. | |
| 7,633,537 B2 | 12/2009 | Hoshuyama | |
| 7,714,915 B2 * | 5/2010 | Endo et al. | 348/272 |
| 7,733,401 B2 * | 6/2010 | Takeda | 348/308 |
| 7,745,773 B1 * | 6/2010 | Merrill | 250/208.1 |
| 8,471,939 B2 * | 6/2013 | Tivarus et al. | 348/308 |
| 2003/0189656 A1 | 10/2003 | Shinohara | |
| 2005/0185073 A1 | 8/2005 | Watanabe | |
| 2005/0212934 A1 * | 9/2005 | Hoshuyama | 348/272 |
| 2006/0181623 A1 | 8/2006 | Endo et al. | |

FOREIGN PATENT DOCUMENTS

| | | |
|---|---|---|
| JP | A-2001-016598 | 1/2001 |
| JP | A-2003-298038 | 10/2003 |
| JP | A-2005-244435 | 9/2005 |
| JP | A-2005-318292 | 11/2005 |
| JP | A-2006-165362 | 6/2006 |
| JP | A-2008-258430 | 10/2008 |
| JP | A-2009-268078 | 11/2009 |
| WO | WO 2004/056127 A1 | 7/2004 |

OTHER PUBLICATIONS

Office Action issued in European Patent Application No. 03 778 803.1, on Aug. 18, 2009.

Sep. 4, 2012 Japanese Notification of Reasons for Refusal issued in Patent Application No. 2010-174881 (with translation).

* cited by examiner

SOLID STATE IMAGE SENSOR WITH PLURAL OVERLAPPING PHOTOELECTRIC CONVERSION UNITS

INCORPORATION BY REFERENCE

The disclosure of the following priority application is herein incorporated by reference:
Japanese Patent Application No. 2009-185343 filed Aug. 8, 2009
Japanese Patent Application No. 2010-174881 filed Aug. 3, 2010

BACKGROUND OF THE INVENTION

1. Field of the Invention

The present invention relates to a solid-state image sensor.

2. Description of Related Art

The pixels in a standard solid-state image sensor in the related art may each include a single photoelectric conversion unit, with a color filter in one of three colors (R, G and B) disposed on each pixel. In such a solid-state image sensor, an R color signal, a G color signal or a B color signal is obtained from a given photoelectric conversion unit.

The solid-state image sensor disclosed in Japanese Laid Open Patent Publication No. 2006-165362 is distinct from the image sensor described above in that at least some of its pixels are equipped with two or more photoelectric conversion units disposed in alignment with one another along the direction in which light enters. Namely, this solid-state image sensor comprises a pixel A equipped with photoelectric conversion units constituted with at least two PN junction portions formed along the depth of a semiconductor substrate, a pixel B equipped with a photoelectric conversion unit constituted with at least one PN junction portion, a first color filter disposed on the pixel A, a second color filter disposed on the pixel B and a detection means for detecting a first color signal and a second color signal from the two PN junction portions at the pixel A and detecting a third color signal from the PN junction portion at the pixel B. A first color signal, a second color signal or a third color signal is obtained from a given photoelectric conversion unit in the solid-state image sensor.

SUMMARY OF THE INVENTION

However, there is a limit to the extent to which the color reproducibility is improved through any of the solid-state image sensors in the related art described above, since they simply provide color signals in three different colors.

The color reproducibility may be improved by assuring more polychromatic spectral sensitivity characteristics in the photoelectric conversion units so that the spectral sensitivity characteristics represent four or more colors in a solid-state image sensor such as those described above. For instance, color filters in four or more colors may be disposed in a solid-state sensor with pixels thereof each equipped with a single photoelectric conversion unit. However, higher color reproducibility will only be achieved at the expense of resolution in such a case.

The present invention, having been conceived to address the issues discussed above, provides a solid-state image sensor capable of capturing an image by giving priority to assuring good color reproduction without sacrificing resolution.

According to the 1st aspect of the present invention, a solid-state image sensor comprises: four or more photoelectric conversion units having spectral sensitivity characteristics different from one another; an amplifier unit disposed in correspondence to each group of photoelectric conversion units among N groups (N represents an integer less than a quantity of the four or more photoelectric conversion units and equal to or greater than one), the four or more photoelectric conversion units being divided into the N groups; and transfer units, each disposed in correspondence to one of the four or more photoelectric conversion units, which transfer a signal generated at the photoelectric conversion unit to the amplifier unit disposed for the group to which the photoelectric conversion unit belongs.

According to the 2nd aspect of the present invention, it is preferred that in the solid-state image sensor according to the 1st aspect, a plurality of photoelectric conversion units belonging to a single group have successive spectral sensitivity characteristics.

According to the 3rd aspect of the present invention, the solid-state image sensor according to the 1st aspect may further comprise a floating capacitor unit disposed at an input portion of the amplifier unit installed in correspondence to each group.

According to the 4th aspect of the present invention, it is preferred that in the solid-state image sensor according to the 1st aspect, charge storage layers, each constituting one of a plurality of photoelectric conversion units belonging to a single group, are disposed in alignment with one another along a direction in which light enters.

According to the 5th aspect of the present invention, in the solid-state image sensor according to the 1st aspect color filters having different spectral transmittance characteristics in correspondence to the individual groups may be disposed on a light-entry side of the photoelectric conversion units.

According to the 6th aspect of the present invention, it is preferred that in the solid-state image sensor according to the 4th aspect, the quantity of the four or more photoelectric conversion units is six, N is equal to three and a quantity of photoelectric conversion units belonging to each group is two.

According to the 7th aspect of the present invention, the solid-state image sensor according to the 1st aspect may further comprise a control unit that enables selective execution of operation at the photoelectric conversion units in a first operation mode or a second operation mode by controlling the transfer units, wherein: in the first operation mode, signals corresponding to signals generated in a plurality of photoelectric conversion units are separately output from the amplifier unit, the plurality of photoelectric conversion units among the four or more photoelectric conversion units belonging to a given group; and in the second operation mode, a signal corresponding to a signal representing a sum of signals generated in the plurality of photoelectric conversion units is output from the amplifier unit, the plurality of photoelectric conversion units among the four or more photoelectric conversion units belonging to the given group.

According to the 8th aspect of the present invention, the solid-state image sensor according to the 1st aspect may further comprise a control unit that enables selective execution of operation at the photoelectric conversion units in a first operation mode or a second operation mode by controlling the transfer units, wherein: in the first operation mode, signals corresponding to individual signals generated in a plurality of photoelectric conversion units, are output separately from the amplifier unit, the plurality of photoelectric conversion units belonging to a given group; and in the second operation mode, a signal corresponding to a signal generated in a photoelectric conversion unit among the plurality of photoelectric conversion units is separately output from the amplifier unit and a signal corresponding to a signal representing a sum of signals generated in two or more photoelectric conversion units among the plurality of photoelectric conversion units is also output from the amplifier unit, the plurality of photoelectric conversion units belonging to the given group.

According to the 9th aspect of the present invention, a solid-state image sensor comprises: four or more photoelectric conversion units having spectral sensitivity characteristics different from one another; and color filters having spectral transmittance characteristics different from one another, each of which is in correspondence to one of N (N represents an integer less than a quantity of the four or more photoelectric conversion units and equal to or greater than three) groups of photoelectric conversion units, a plurality of photoelectric conversion units among the four or more photoelectric conversion units belonging to each of the N groups, wherein: the color filters are disposed on a light-entry side of the plurality of photoelectric conversion units belonging to each specific group; and charge storage layers each constituting one of the plurality of photoelectric conversion units belonging to the specific group are disposed in alignment with one another along a direction in which light enters.

According to the 10th aspect of the present invention, it is preferred that in the solid-state image sensor according to the 9th aspect, the quantity of the four or more photoelectric conversion units is six, N is equal to three and a quantity of photoelectric conversion units belonging to each group is two.

According to the 11th aspect of the present invention, it is preferred that in the solid-state image sensor according to the 6th aspect, the three groups each include a first photoelectric conversion unit with a charge storage layer thereof disposed on a light-entry side and a second photoelectric conversion unit with a charge storage layer thereof disposed on a side opposite from the light-entry side; the three first photoelectric conversion units in the three groups are formed so as to satisfy a first condition and the three second photoelectric conversion units in the three groups are formed so as to satisfy a second condition; and the first condition stipulates that the charge storage layers each constituting one of the three first photoelectric conversion units assume positions with a uniform depth measured from a semiconductor surface on the light-entry side and the second condition stipulates that the charge storage layers each constituting one of the three second photoelectric conversion units assume positions with a uniform depth measured from the semiconductor surface on the light-entry side.

According to the 12th aspect of the present invention, it is preferred that in the solid-state image sensor according to the 6th aspect, the three groups each include a first photoelectric conversion unit with a charge storage layer thereof disposed on a light-entry side and a second photoelectric conversion unit with a charge storage layer thereof disposed on a side opposite from the light-entry side; the three first photoelectric conversion units in the three groups and the three second photoelectric conversion units in the three groups are formed so that at least one of a first condition and a second condition is not satisfied; and the first condition stipulates that the charge storage layers each constituting one of the three first photoelectric conversion units assume positions with a uniform depth measured from a semiconductor surface on the light-entry side and the second condition stipulates that the charge storage layers each constituting one of the three second photoelectric conversion units assume positions with a uniform depth measured from the semiconductor surface on the light-entry side.

According to the 13th aspect of the present invention, it is preferred that in the solid-state image sensor according to the 10th aspect, the three groups each include a first photoelectric conversion unit with a charge storage layer thereof disposed on a light-entry side and a second photoelectric conversion unit with a charge storage layer thereof disposed on a side opposite from the light-entry side; the three first photoelectric conversion units in the three groups are formed so as to satisfy a first condition and the three second photoelectric conversion units in the three groups are formed so as to satisfy a second condition; and the first condition stipulates that the charge storage layers each constituting one of the three first photoelectric conversion units assume positions with a uniform depth measured from a semiconductor surface on the light-entry side and the second condition stipulates that the charge storage layers each constituting one of the three second photoelectric conversion units assume positions with a uniform depth measured from the semiconductor surface on the light-entry side.

According to the 14th aspect of the present invention, it is preferred that in the solid-state image sensor according to the 10th aspect, the three groups each include a first photoelectric conversion unit with a charge storage layer thereof disposed on a light-entry side and a second photoelectric conversion unit with a charge storage layer thereof disposed on a side opposite from the light-entry side; the three first photoelectric conversion units in the three groups and the three second photoelectric conversion units in the three groups are formed so that at least one of a first condition and a second condition is not satisfied; and the first condition stipulates that the charge storage layers each constituting one of the three first photoelectric conversion units assume positions with a uniform depth measured from a semiconductor surface on the light-entry side and the second condition stipulates that the charge storage layers each constituting one of the three second photoelectric conversion units assume positions with a uniform depth measured from the semiconductor surface on the light-entry side.

According to the 15th aspect of the present invention, it is preferred that in the solid-state image sensor according to the 6th aspect, the N groups are made up with a first group, a second group and a third group; the color filters disposed in conjunction with the first group are red color filters; the color filters disposed in conjunction with the second group are green color filters; the color filters disposed in conjunction with the third group are blue color filters; a charge storage layer constituting one of the photoelectric conversion units belonging to the first group is formed at a depth within a range of 0.4 to 0.6 µm measured from a semiconductor surface located on a light-entry side; a charge storage layer constituting another photoelectric conversion unit belonging to the first group is formed at a depth within a range of 2.1 to 2.3 µm measured from the semiconductor surface on the light-entry side; a charge storage layer constituting one of the photoelectric conversion units belonging to the second group is formed at a depth within a range of 0.2 to 0.4 µm measured from the semiconductor surface on the light-entry side; a charge storage layer constituting another photoelectric conversion unit belonging to the second group is formed at a depth within a range of 1.2 to 1.4 µm measured from the semiconductor surface on the light-entry side; a charge storage layer constituting one of the photoelectric conversion units belonging to the third group is formed at a depth within a range of 0.1 to 0.3 µm measured from the semiconductor surface located on the light-entry side; and a charge storage layer constituting another photoelectric conversion unit belonging to the third group is formed at a depth within a range of 0.8 to 1.0 µm measured from the semiconductor surface on the light-entry side.

According to the 16th aspect of the present invention, the solid-state image sensor according to the 1st aspect may further comprise: a second amplifier unit that individually amplifies signals generated based upon outputs from each of the four or more photoelectric conversion units by applying gains different from one another.

According to the 17th aspect of the present invention, the solid-state image sensor according to the 1st aspect may further comprise: a vertical signal line that receives signals generated based upon outputs from each of two or more photoelectric conversion units among the four or more photoelectric conversion units, with timing with which one signal is received different from timing with which another signal is received; a variable gain amplifier that amplifies signals in the vertical signal line or signals corresponding to the signals in the vertical signal line; and a gain control unit that controls a gain at the variable gain amplifier in correspondence to spectral sensitivity characteristics of the photoelectric conversion units corresponding to the signals amplified by the variable gain amplifier.

According to the 18th aspect of the present invention, a solid-state image sensor made up with an array of a plurality of pixels in three different types of pixels having at least three distinct characteristics, the three distinct characteristic being different from one another comprises: two different types of photoelectric conversion units disposed at each of the three different types of pixels and assuming spectral sensitivity characteristics that are different from each other; and an amplifier unit disposed at each of the pixels.

According to the present invention, the solid-state image sensor that can capture an image by giving priority to color reproducibility without lowering the resolution can be produced.

DESCRIPTION OF PREFERRED EMBODIMENTS

The following is a description of the solid-state image sensor according to the present invention, given in reference to drawings.

First Embodiment

Figure 1:
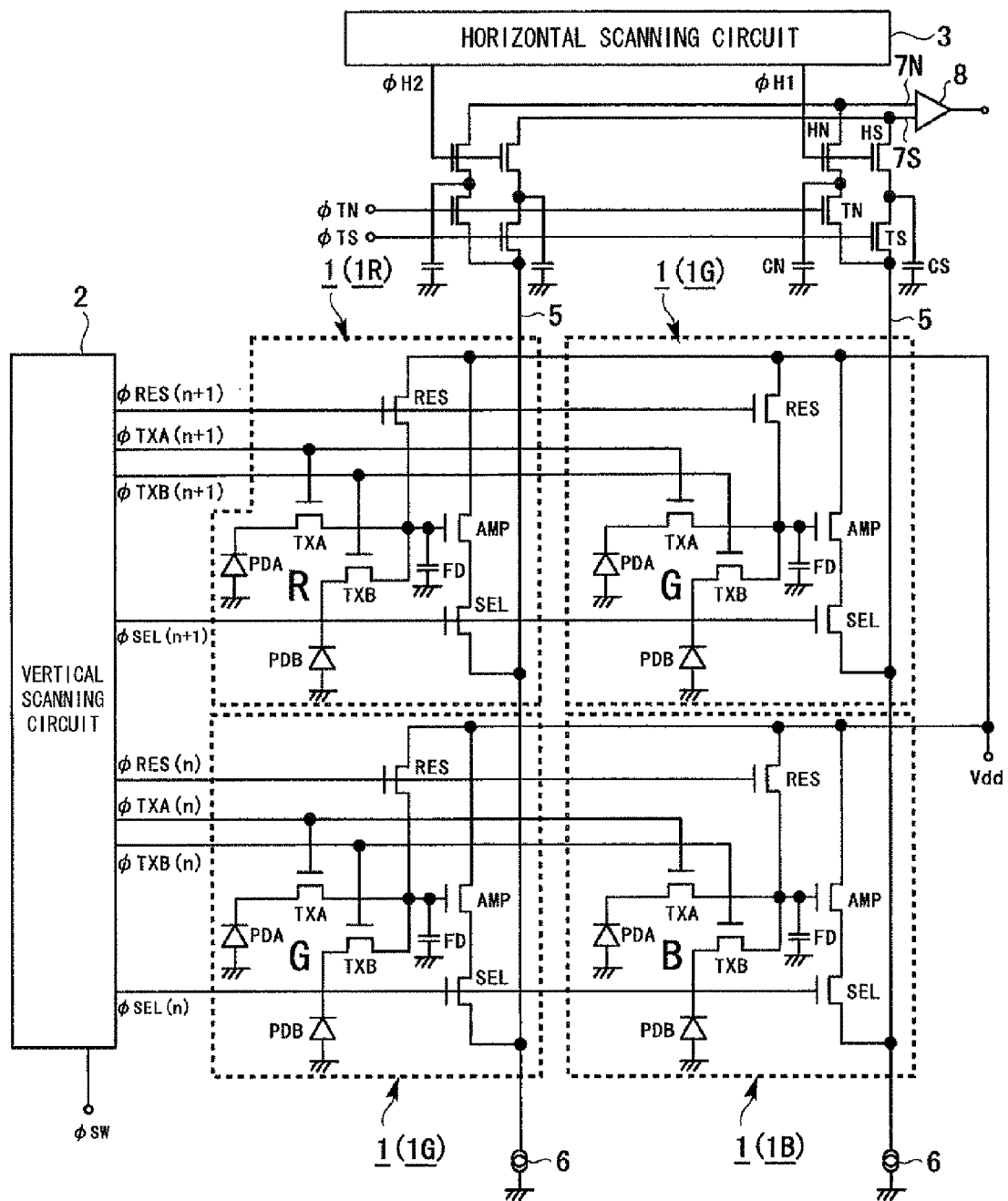
FIG. 1 is a circuit diagram schematically illustrating the structure of the solid-state image sensor achieved in a first embodiment of the present invention.

FIG. 1 is a circuit diagram schematically illustrating the structure adopted in the solid-state image sensor achieved in the first embodiment of the present invention. The solid-state image sensor in the embodiment is a CMOS solid-state image sensor.

The solid-state image sensor in the embodiment comprises a plurality of pixels 1 arrayed in a two-dimensional pattern (the figure only shows 2×2 pixels 1), a vertical scanning circuit 2, a horizontal scanning circuit 3, vertical signal lines 5, a constant current source 6, a first horizontal signal line 7S, a second horizontal signal line 7N and a differential output amplifier 8. The vertical signal lines 5 are each disposed in correspondence to a column of pixels 1. The constant current source 6 is connected to the individual vertical signal lines 5. Through the first horizontal signal line 7S, optical signals containing optical information resulting from photoelectric conversion executed at the pixels 1, are transmitted. Through the second horizontal signal line 7N, differentiation signals each containing a noise component to be subtracted from an optical signals, i.e., dark signals, are transmitted.

Red color filters, green color filters and blue color filters, arranged in a Bayer array, are each disposed at one of the pixels 1. The code letters R, G and B are used in FIG. 1 to indicate the colors of the color filters disposed at the individual pixels, R indicates red, G indicates green and B indicates blue. It is to be noted that the present invention is not limited to an image sensor assuming a Bayer array and it may instead be adopted in an image sensor assuming a stripe pattern or the like. In addition, whenever the individual pixels 1 need to be distinguished in correspondence to the colors of the color filters thereat in the following description, a code 1R will be used to refer to a pixel at which a red color filter is disposed, a code 1G will be used to refer to a pixel at which a green color filter is disposed and a code 1B will be used to refer to a pixel at which a blue color filter is disposed.

The solid-state image sensor in the embodiment further includes an optical signal storage capacitor CS, a dark signal storage capacitor CN, an optical signal vertical transfer transistor TS, a dark signal vertical transfer transistor TN, an optical signal horizontal transfer transistor HS and a dark signal horizontal transfer transistor FIN, all disposed in correspondence to each column of pixels 1. While optical signals are stored in the optical signal storage capacitor CS, dark signals are stored in the dark signal storage capacitor CN. It is to be noted that while the solid-state image sensor also includes transistors used to individually reset the horizontal signal lines 7S and 7N with predetermined timing, illustration of these transistors is not included in the figures.

The pixels 1 in the embodiment each include a first photodiode PDA and a second photodiode PDB, an amplifier transistor AMP, a floating diffusion FD, a first transfer transistor TXA and a second transfer transistor TXB, a reset transistor RES and a selector transistor SEL. The first and second photodiodes PDA and PDB function as first and second photoelectric conversion units that generate and store electrical charges in correspondence to the incident light. The amplifier transistor AMP functions as an amplifier unit that outputs a signal corresponding to the potential at the floating diffusion FD. The floating diffusion FD functions as a floating capacitor unit located at an input portion of the amplifier transistor AMP. The first and second transfer transistors TXA and TXB function as first and second charge transfer units that transfer electrical charges respectively from the first photodiode PDA to the floating diffusion FD and from the second photodiodes PDB to the floating diffusion FD. The reset transistor RES functions as a reset unit that resets the potential at the floating diffusion FD. The selector transistor SEL functions as a selector unit that selects the corresponding pixel 1.

The gate of the first transfer transistor TXA is connected to a control line serving the row in which the particular pixel is located, among control lines each serving a specific row. A control signal ØTXA originating from the vertical scanning circuit 2 is provided via the control line to the gate of the first transfer transistor TXA. The gate of the second transfer transistor TXB is connected to a control line serving the row in which the particular pixel is located, among control lines each serving a specific row. A control signal ØTXB originating from the vertical scanning circuit 2 is provided via the control line to the gate of the second transfer transistor TXB. The gate of the reset transistor RES is connected to a control line serving the row in which the particular pixel is located, among control lines each serving a specific row. A control signal ORES originating from the vertical scanning circuit 2 is provided via the control line to the gate of the reset transistor RES. The gate of the selector transistor SEL is connected to a control line serving the row in which the particular pixel is located, among control lines each serving a specific row. A control signal OSEL originating from the vertical scanning circuit 2 is provided via the control line to the gate of the selector transistor SEL. Vdd in FIG. 1 indicates a source voltage.

The vertical scanning circuit 2 constitutes a control unit that outputs a selector pulse ØSEL, a reset pulse ORES and first and second transfer pulses ØTXA and ØTXB in correspondence to each row of pixels 1. The horizontal scanning circuit 3 outputs horizontal scanning signals ØH1 and ØH2 in correspondence to each column of pixels.

Figure 2:
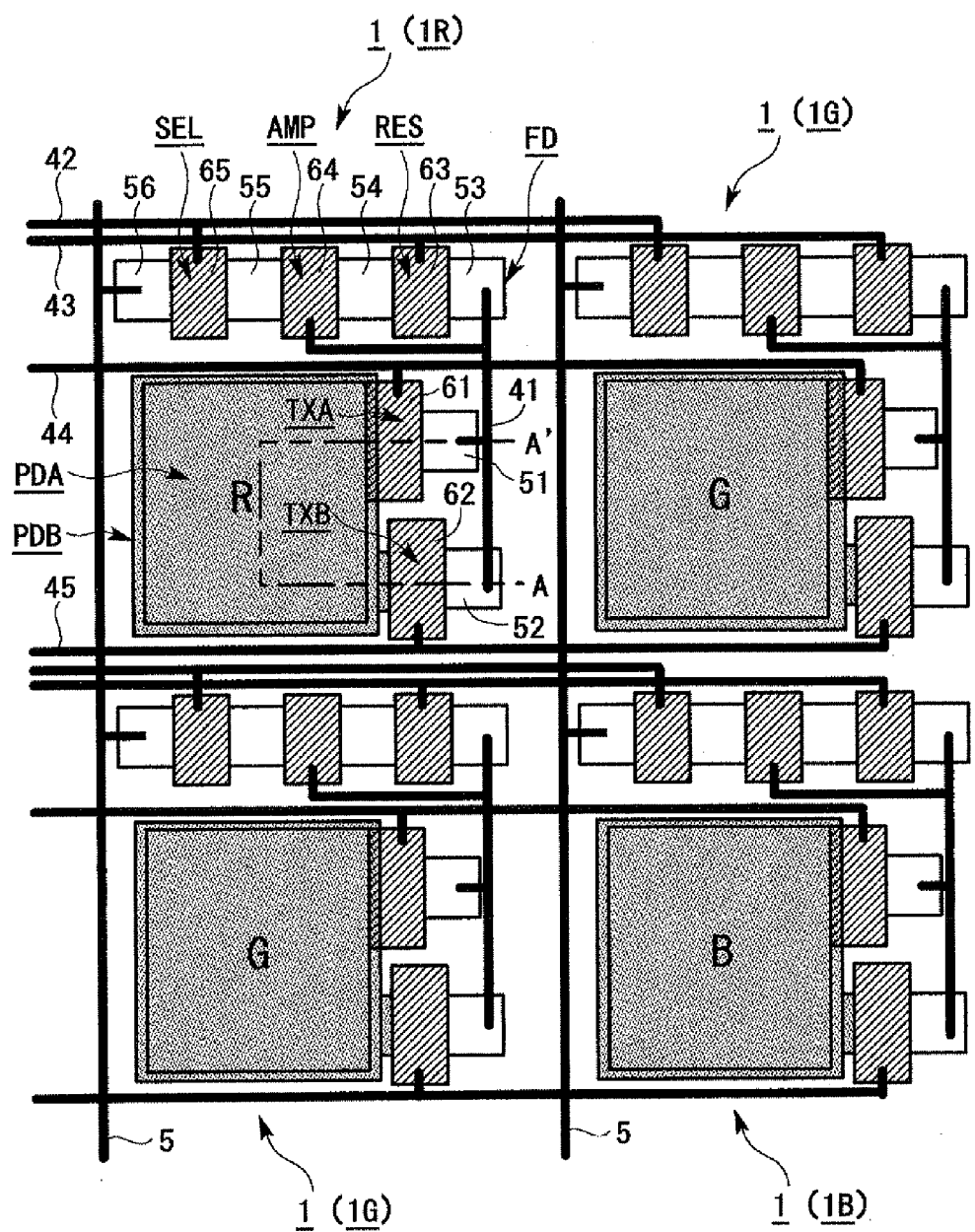
FIG. 2 is a schematic plan view of the solid-state image sensor in FIG. 1 over a 2×2 pixel area.
Figure 3:
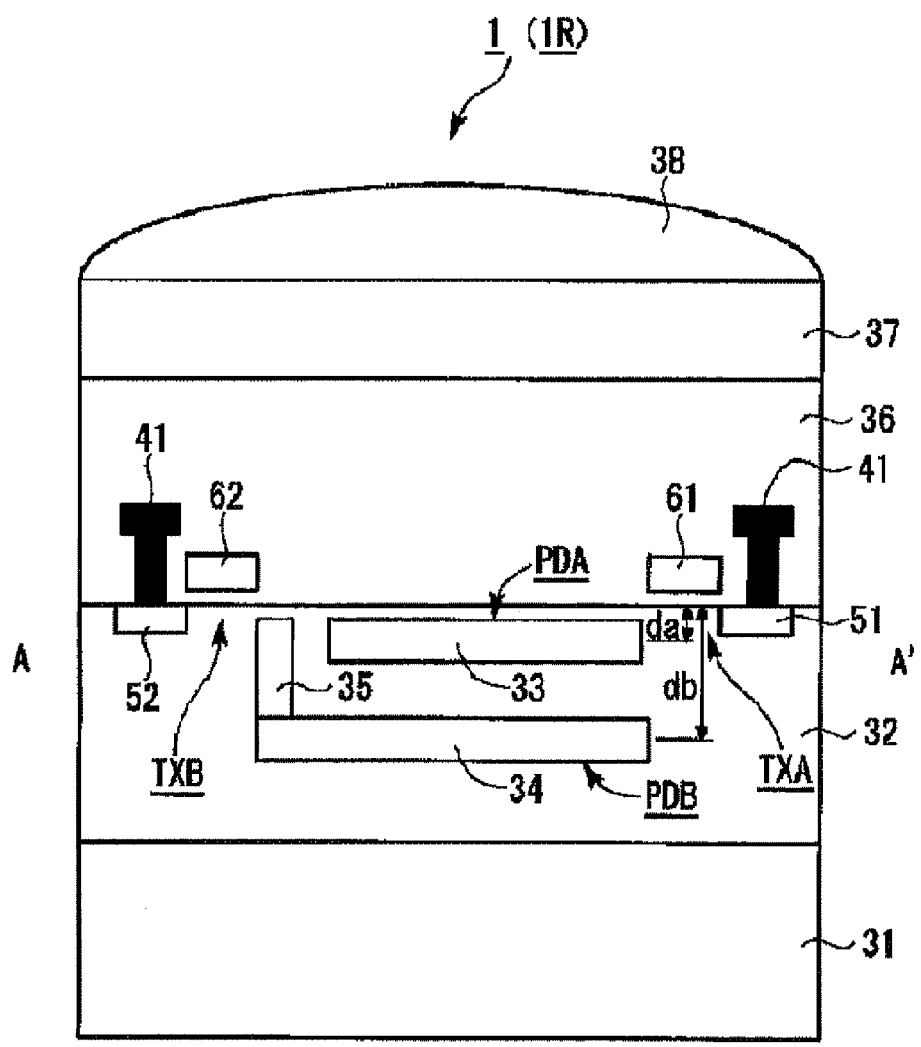
FIG. 3 is a schematic sectional view taken along line A-A' in FIG. 2.

FIG. 2 is a schematic plan view of the solid-state image sensor in FIG. 1 over an area where 2×2 pixels 1 are present. FIG. 2 does not include illustration of color filters 37, micro lenses 38 and the like. FIG. 3 is a schematic sectional view taken along line A-A' in FIG. 2. FIG. 3 is a simplified illustration of the essential structure of a pixel 1.

Pixels in the embodiment each include a P-type well 32 formed on an N-type silicon substrate 31. Various elements of the pixel, such as the photodiodes PDA and PDB, are disposed in the P-type well 32.

Reference numerals 51 through 56 in FIG. 2 indicate N-type impurity diffusion areas constituting parts of the various transistors described earlier. Reference numerals 61 through 65 each indicate a gate electrode of a transistor. It is to be noted that the diffusion area 54 is a source diffusion portion to which the source voltage Vdd is applied. The diffusion areas 51 through 53 constitute the floating diffusion FD. The diffusion areas 51 through 53 are connected with one another via a wiring 41 and are also connected to the gate electrode 64 of the amplifier transistor AMP. A wiring 42, a wiring 43, a wiring 44 and a wiring 45 in FIG. 2 respectively function as the control line through which the selector pulse ØSEL is provided, the control line through which the reset pulse ØRES is provided, the control line through which the first transfer pulse ØTXA is provided and the control line through which the second transfer pulse ØTXB is provided.

The first photodiode PDA is constituted with an N-type charge storage layer 33 assuming a relatively shallow position within the P-type well 32. The second photodiode PDB is constituted with an N-type charge storage layer 34 assuming a relatively deep position within the P-type well 32. The charge storage layers 33 and 34 are disposed in alignment with each other along the direction in which light enters (along the up/down direction in FIG. 3).

Light with a relatively short wavelength undergoes photoelectric conversion primarily over an area relatively close to the silicon surface (at a relatively shallow position) and an electrical charge generated through the photoelectric conversion is stored in the charge storage layer 33 constituting the first photodiode PDA. The electrical charge stored in the charge storage layer 33 at the first photodiode PDA is transferred to the floating diffusion FD as the first transfer transistor TXA enters an ON state. Light with a relatively long wavelength undergoes photoelectric conversion primarily over an area relatively far from the silicon surface and an electrical charge generated through the photoelectric conversion is stored in the charge storage layer 34 constituting the second photodiode PDB. An N-type impurity diffusion area 35, through which the electrical charge stored in the charge storage layer 34 is guided toward the silicon surface, is present within the P-type well 32. The electrical charge stored in the charge storage layer 34 at the second photodiode PDB is transferred to the floating diffusion FD as the second transfer transistor TXB enters an ON state.

The first transfer transistor TXA is a MOS transistor with the charge storage layer 33 at the first photodiode PDA forming a source thereof and the diffusion area 51 constituting part of the floating diffusion FD forming a drain thereof. The first transfer transistor TXA is driven with the control signal ØTXA applied to the gate electrode 61 thereof. The second transfer transistor TXB is a MOS transistor with the charge storage layer 34 and the diffusion area 35 forming a source thereof and the diffusion area 52 constituting part of the floating diffusion FD forming a drain thereof. The second transfer transistor TXB is driven with the control signal ØTXB applied to the gate electrode 62 thereof.

The electrical charges stored in the first photodiode PDA and the second photodiode PDB are transferred to the floating diffusion FD, either separately or simultaneously, via the first transfer transistor TXA and the second transfer transistor TXB respectively. Such an electrical charge is converted to a voltage at the floating diffusion FD, and the voltage resulting from the conversion is applied to the gate electrode 64 of the amplifier transistor AMP. The amplifier transistor AMP then outputs an electrical signal corresponding to the voltage at the gate electrode 64 thereof.

The selector transistor SEL is a MOS transistor with the diffusion area 55 forming a drain thereof and the diffusion area 56 forming a source thereof. As the selector transistor SEL enters an ON state, the output from the amplifier transistor AMP is provided to the vertical signal line 5. Namely, a source follower read is enabled via the amplifier transistor AMP and the selector transistor SEL.

The reset transistor RES is a MOS transistor with the source diffusion portion 54 forming a drain thereof and the diffusion area 53 constituting part of the floating diffusion FD forming a source thereof. As the reset transistor RES enters an ON state, the electrical charge stored in the floating diffusion FD is reset.

As shown in FIG. 3, a layer insulating film 36 is formed upon the P-type well 32. The circuit wiring described earlier is achieved with a plurality of metal wiring layers disposed within the layer insulating film 36. FIG. 3 only shows a single metal wiring layer constituting the wiring 41. The color filter 37 is formed over the layer insulating film 36 and a micro lens 38 is formed over the color filter 37. Light condensed via the micro lens 38 is thus received at the first and second photodiodes PDA and PDB via the color filter 37.

The color filter 37 disposed at a pixel 1R is a red color filter. The color filter 37 disposed at a pixel 1G is a green color filter. The color filter 37 disposed at a pixel 1B is a blue color filter. Apart from the different colors of the individual color filters 37, all the pixels 1 (1R, 1G and 1B) assume identical structures. The charge storage layers 33 constituting the first photodiodes PDA in the pixels 1 (1R, 1G and 1B) all assume a uniform depth da in the embodiment. The depth da of the charge storage layers 33 represents a distance measured from the semiconductor surface on the light-entry side (the surface of the silicon with the charge storage layer 33 disposed therein, or more specifically, the surface of the P-type well 32 in this example) to the position at which the impurity concentration in the charge storage layer 33 peaks along the up/down direction in FIG. 3 in the embodiment.

In addition, the charge storage layer 34 constituting the second photodiodes PDB in the pixels 1 (1R, 1G and 1B) all assume a uniform depth db in the embodiment. The depth db of the charge storage layers 34 represents a distance measured from the semiconductor surface on the light-entry side (the surface of the silicon with the charge storage layer 34 disposed therein, or more specifically, the surface of the P-type well 32 in this example) to the position at which the impurity concentration in the charge storage layer 34 peaks along the up/down direction in FIG. 3 in the embodiment.

Figure 4:
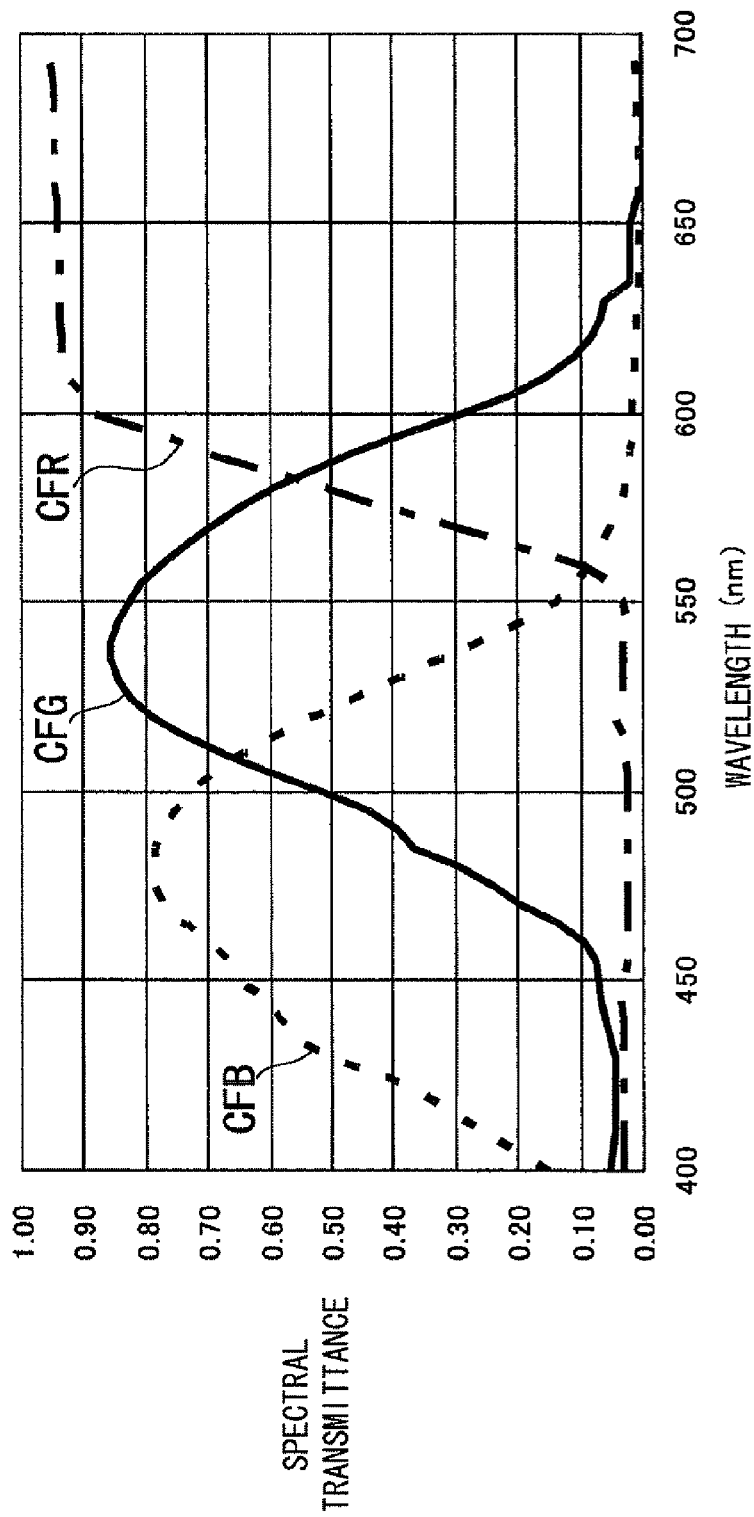
FIG. 4 shows the spectral transmittance characteristics of color filters.

Curves CFR, CFG and CFB in FIG. 4 respectively represent examples of the spectral transmittance of a red color filter, a green color filter and a blue color.

Figure 5:
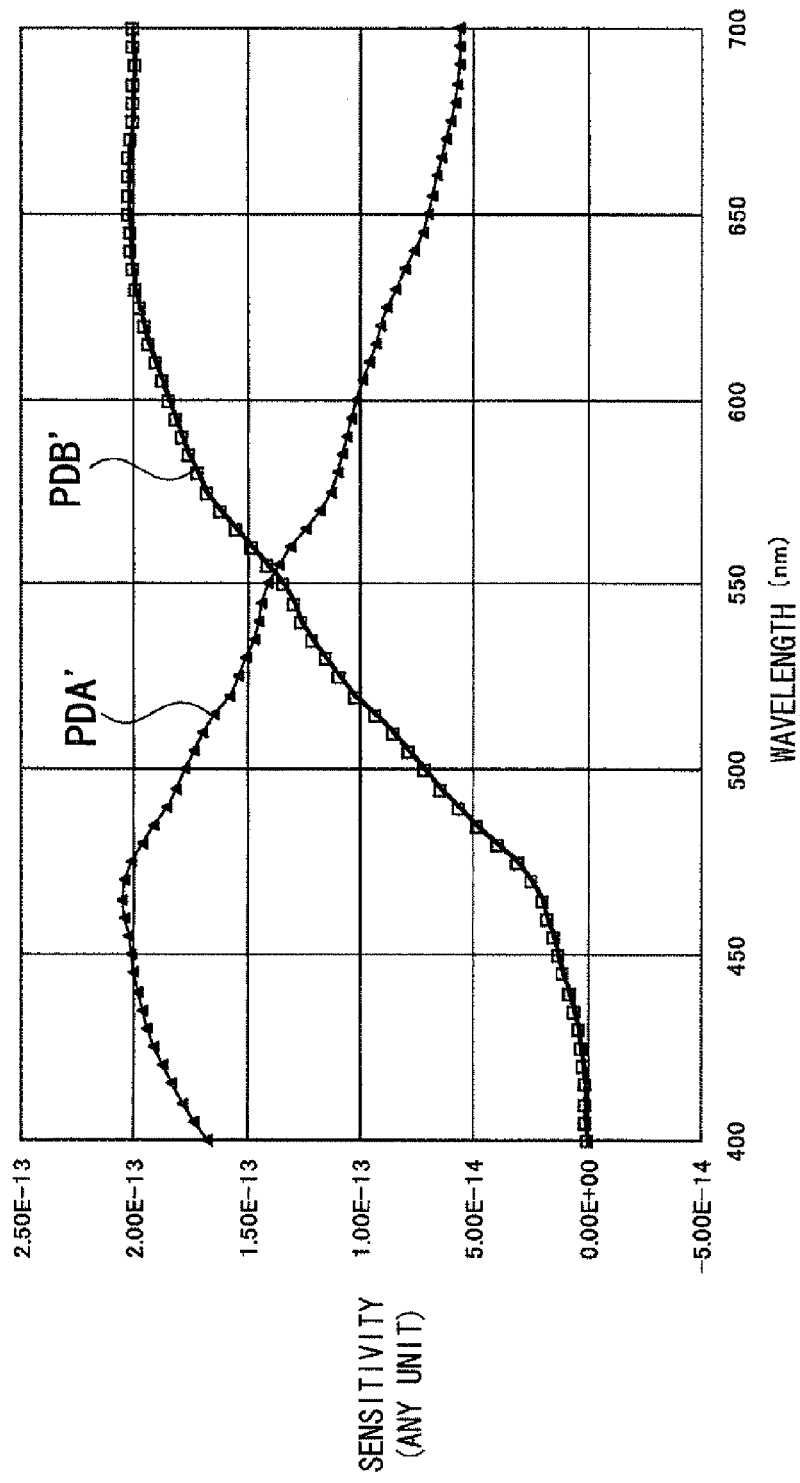
FIG. 5 presents an example of results that may be obtained by simulating the initial spectral sensitivity characteristics of the first and second photodiodes in a given pixel.

FIG. 5 presents an example of results that may be obtained by simulating the initial spectral sensitivity characteristics (i.e., the spectral sensitivity characteristics observed before disposing a color filter 37) of the first and second photodiode PDA and PDB at each pixel 1. PDA' and PDB' in FIG. 5 respectively represent the initial spectral sensitivity characteristics of the first photodiode PDA and the initial spectral sensitivity characteristics of the second photodiode PDB. The spectral sensitivity characteristics are simulated for a first photodiode PDA with the charge storage layer 33 thereof formed approximately 0.2 μm deep measured from the silicon surface and a second photodiode PDB with the charge storage layer 34 thereof formed approximately 1.3 μm deep measured from the silicon surface. In other words, spectral sensitivity characteristics are simulated by assuming that da=0.2 μm and that db=1.3 μm for all the pixels 1 (1R, 1G and 1B).

Figure 6:
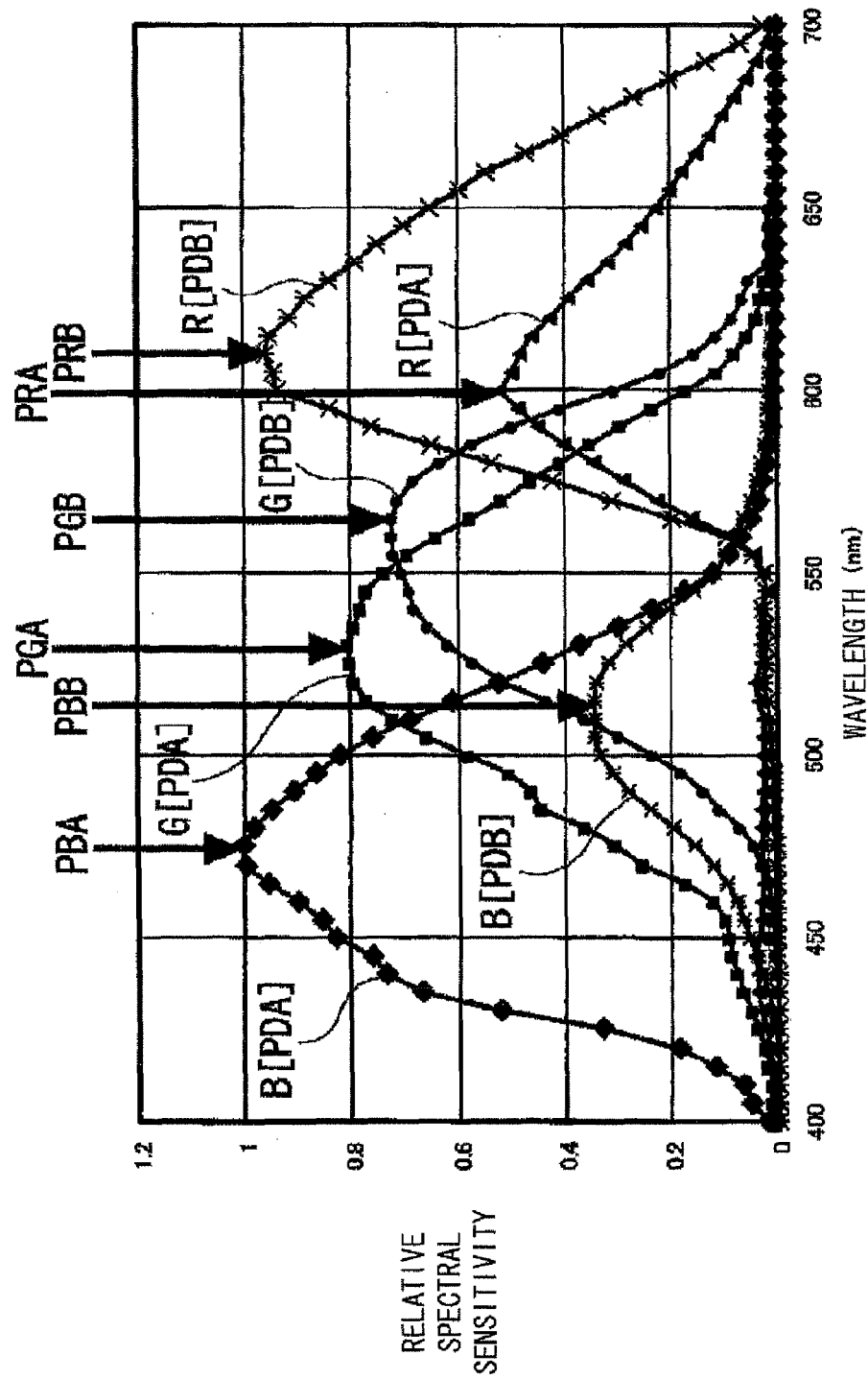
FIG. 6 presents an example of spectral sensitivity characteristics of the first and second photodiodes that may be observed in the individual pixels.

The solid-state image sensor in the embodiment is utilized in practical applications with IR cut filters (not shown) disposed on the light-entry side of the micro lenses 38. FIG. 6 shows spectral sensitivity characteristics of the first and second photodiodes PDA and PDB at the various pixels 1R, 1G and 1B, with the IR cut filter spectral transmittance characteristics incorporated therein. In FIG. 6, R[PDA] denotes the spectral sensitivity of the first photodiode PDA at the pixel IR, R[PDB] denotes the spectral sensitivity of the second photodiode PDB at the pixel IR, G[PDA] denotes the spectral sensitivity of the first photodiode PDA at the pixel IG, G[PDB] denotes the spectral sensitivity of the second photodiode PDB at the pixel IG, B[PDA] denotes the spectral sensitivity of the first photodiode PDA at the pixel IB and B[PDB] denotes the spectral sensitivity of the second photodiode PDB at the pixel IB.

These characteristics curves indicate spectral sensitivity characteristics different from one another. For instance, R[PDA] in FIG. 6 is achieved by superimposing the spectral transmittance at the IR cut filter on CFR in FIG. 4 and PDA' in FIG. 5. R[PDB], G[PDA], G[PDB], B[PDA] and B[PDB] in FIG. 6 are likewise achieved by superimposing the IR cut filter spectral transmittance on the spectral transmittance characteristics in FIG. 4 and the spectral sensitivity characteristics in FIG. 5. PBA, PBB, PGA, PGB, PRA and PRB in FIG. 6 respectively denote the peaks of the spectral sensitivity characteristics B[PDA], B[PDB], G[PDA], G[PDB], R[PDA] and R[PDB].

Figure 7:
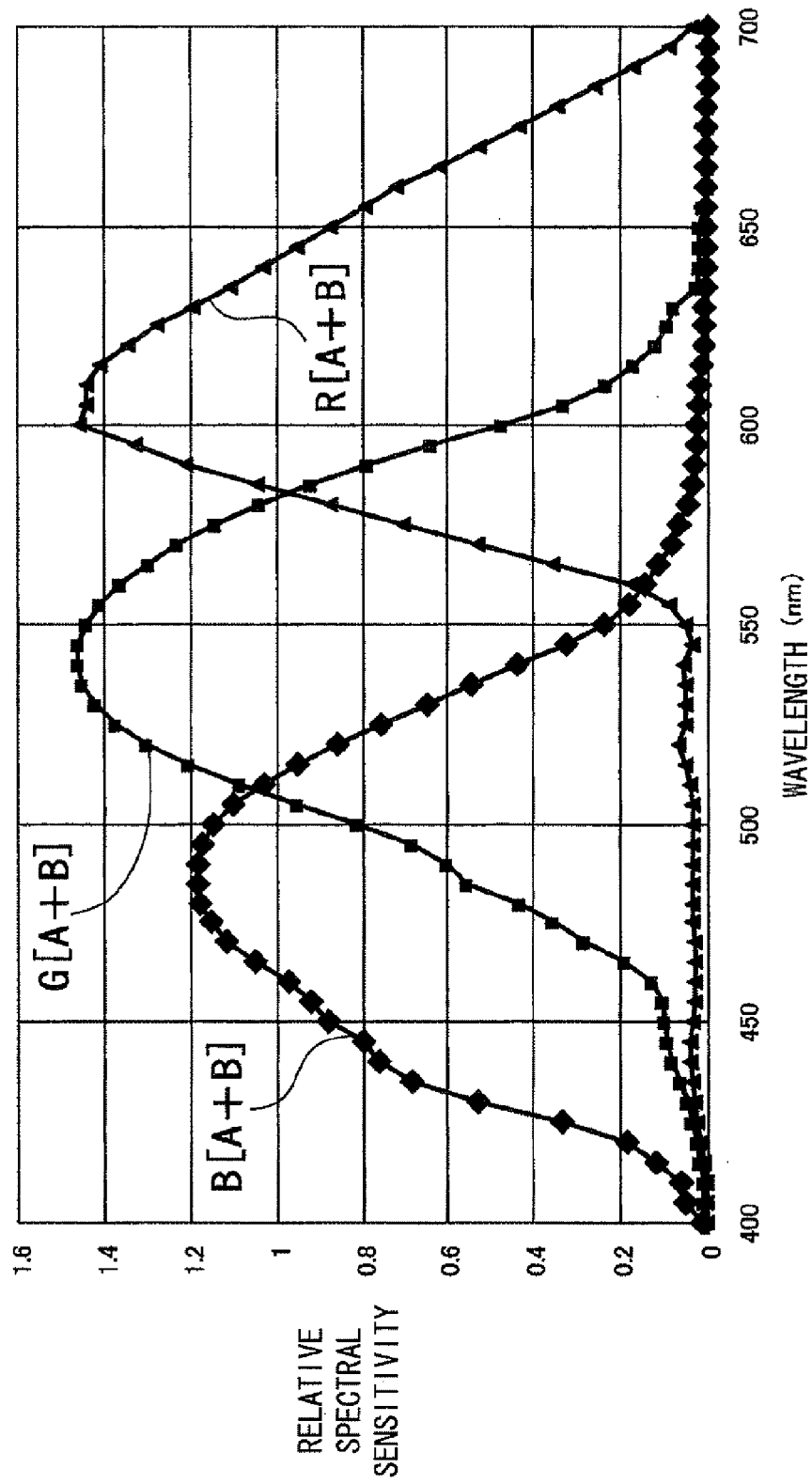
FIG. 7 shows spectral sensitivity characteristics curves each obtained by adding together a pair of spectral sensitivity characteristics curves shown side-by-side in FIG. 6.

FIG. 7 shows spectral sensitivity characteristics R[A+B] achieved by adding up the spectral sensitivity characteristics R[PDA] and the spectral sensitivity characteristics R[PDB] shown next to each other in FIG. 6, spectral sensitivity characteristics G[A+B] achieved by adding up the spectral sensitivity characteristics G[PDA] and the spectral sensitivity characteristics G[PDB] shown next to each other in FIG. 6, and spectral sensitivity characteristics B[A+B] achieved by adding up the spectral sensitivity characteristics B[PDA] and the spectral sensitivity characteristics B[PDB] shown next to each other in FIG. 6.

Figure 8:
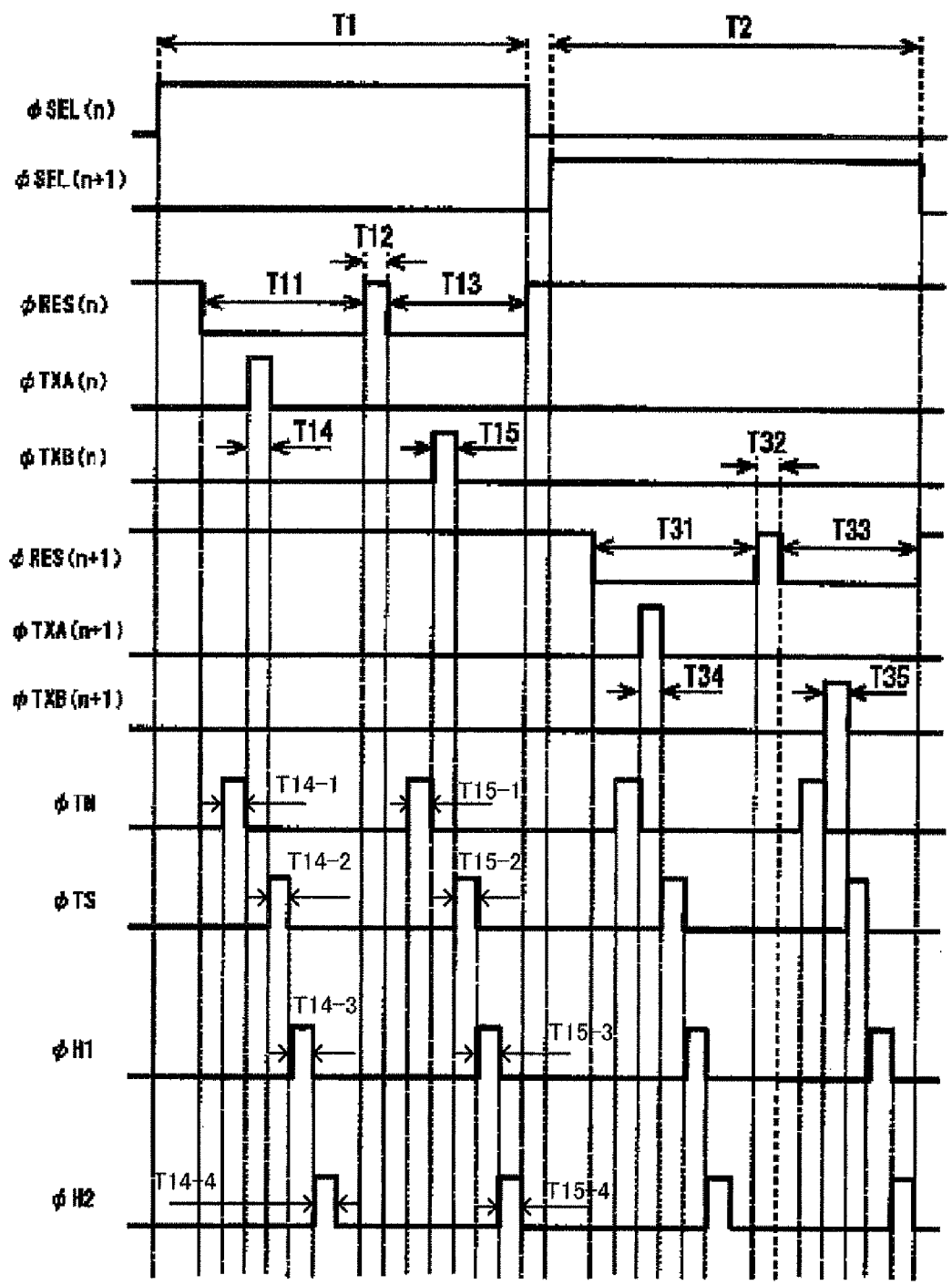
FIG. 8 is a timing chart of a first operation mode assumed in the solid-state image sensor in the first embodiment of the present invention.

FIG. 8 is a timing chart of the operation executed in the solid-state image sensor assuming a first operation mode in the embodiment. In the first operation mode, the signals provided from the first and second photodiodes PDA and PDB at each pixel 1 are individually read out. It is to be noted that when the signals in FIG. 3 are at high level, the transistor corresponding to the individual signals are in the ON state, whereas when the signals are at low level, the corresponding transistors are in the OFF state. (n) indicates a signal provided for row n. This principle also applies in the description to be given later in reference to FIGS. 9 and 10.

Figure 9:
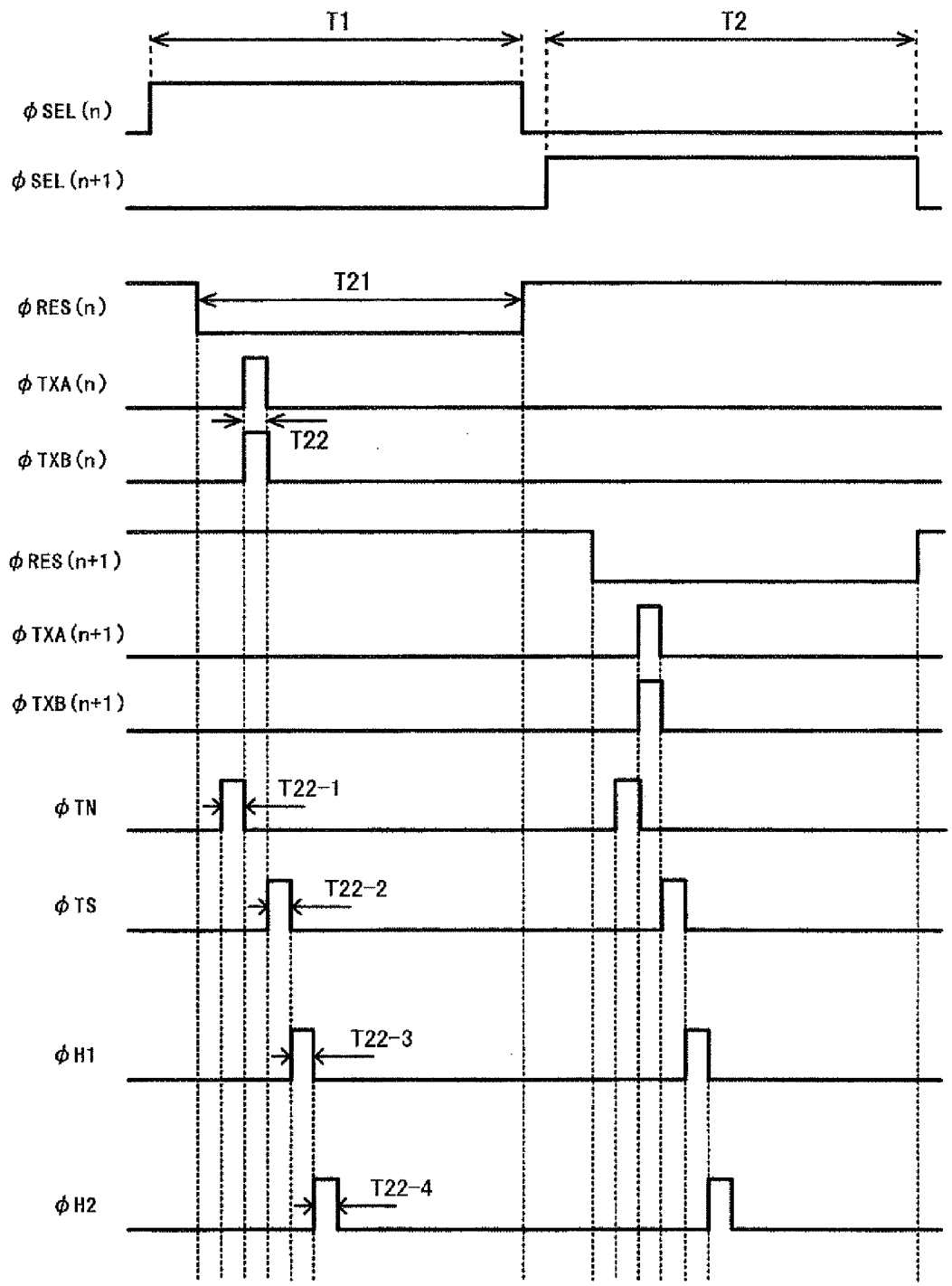
FIG. 9 is a timing chart of a second operation mode assumed in the solid-state image sensor in the first embodiment of the present invention.
Figure 10:
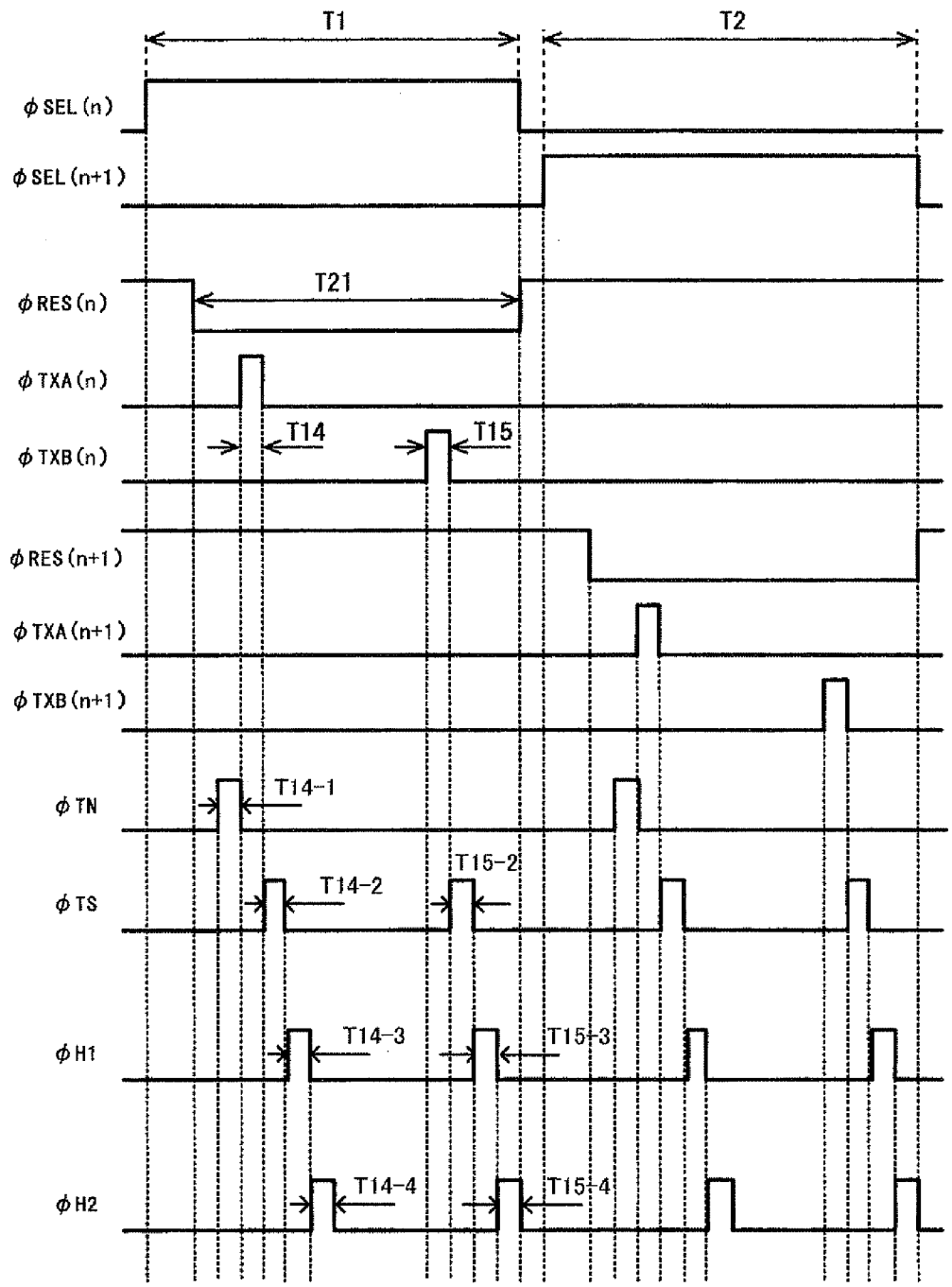
FIG. 10 is a timing chart of a third operation mode assumed in the solid-state image sensor in a second embodiment of the present invention.

After electrical charges are stored in the charge storage layers 33 and 34 of the first and second photodiodes PDA and PDB of the pixels 1 with the mechanical shutter (not shown) held in an open state for the duration matching a predetermined exposure period, pixels 1 are selected in units of rows, i.e., one row at a time, in sequence and identical operations are executed in sequence for the individual rows. FIG. 8 shows the operation that will be executed when the pixels 1 in row n are selected and then the pixels 1 in row n+1 are selected. The operations to be described later in reference to FIGS. 9 and 10 are also executed by selecting the pixels 1 in row n and then the pixels 1 in row n+1 in the same order.

T1 indicates the period of time during which the pixels 1 in row n are selected, whereas T2 indicates the period of time during which the pixels 1 in row n+1 are selected. During the period T1, ØSEL(n) is held at high level, and the selector transistors SEL in row n remain in the ON state. This is also the case in the operations to be described in reference to FIGS. 9 and 10.

The reset transistors RES in row n remain in the OFF state through a period T11 during the period T1. Then, at the start of a period T12, the reset transistors RES in row n are turned on. The reset transistors RES in row n are subsequently turned off at the beginning of a period T13. The reset transistors RES in row n are held in the ON state except for during the periods T11 and T13.

At the beginning of a period T14 during the period T11, the first transfer transistors TXA in row n are turned on and thus, the signal charges at the first photodiodes PDA in the pixels 1 in row n are transferred to the floating diffusions FD at the pixels 1 in row n. ØTN is turned on at the beginning of a period T14_1 preceding the period T14 during the period T11 and thus, dark signals are stored in the dark signal storage capacitors CN. ØTS is turned on at the beginning of a period T14_2 following the period T14 during the period T11 and thus, optical signals in the first photodiodes PDA at the pixels 1 in row n are stored in the optical signal storage capacitors CS. Subsequently, ØH1 and ØH2 are sequentially set to high level at the beginning of a period T14_3 and at the beginning of a period T14_4 horizontal scanning is executed in response and signals corresponding to the differences between the optical signals and the dark signals are output to the outside through the differential output amplifier 8.

At the beginning of a period T15 during the period T13, the second transistors TXB in row n are turned on and thus, the signal charges at the second photodiodes PDB in the pixels 1 in row n are transferred to the floating diffusions FD at the pixels 1 in row n. ØTN is turned on at the beginning of a period T15_1 preceding the period T15 during the period T13 and thus, dark signals are stored in the dark signal storage capacitors CN. ØTS is turned on at the beginning of a period T15_2 during the period T13 and thus, optical signals in the second photodiodes PDB at the pixels 1 in row n are stored in the optical signal storage capacitors CN. Subsequently, ØH1 and ØH2 are sequentially set to high level at the beginning of a period T15_3 and at the beginning of a period T15_4 horizontal scanning is executed in response, and signals corresponding to the differences between the optical signals and the dark signals are output to the outside through the differential output amplifier 8.

Operation similar to that executed during the period T1 through which the pixels 1 in row n are selected, are executed during the period T2 through which the pixels 1 in row n+1 are selected and during a period through which the pixels 1 in another row are selected. It is to be noted that periods T31 to T35 occurring during the period T2 through which the pixels 1 in row n+1 are selected respectively correspond to the periods T11 to T15 occurred during the period T1 through which the pixels 1 in row n are selected.

Through the operation executed in the first operation mode described above, the signals from the first and second photodiodes PDA and PDB at each pixel 1 are individually read out, instead of as the sum thereof. This means that signals corresponding to the six different types of spectral sensitivity characteristics R[PDA], R[PDB], G[PDA], G[PDB], B[PDA] and B[PDB] are separately read out in the first operation mode. The first operation mode thus assures better color reproducibility through a broader range of color spectral sensitivity characteristics compared to the related art, in which signals are obtained only in correspondence to three different types of spectral sensitivity characteristics, R, G and B, albeit the SN ratio is bound to decrease due to a relatively low signal level assumed by the individual signals in the first operation mode. In addition, since the first and second photodiodes PDA and PDB are disposed in alignment with each other along the direction in which light enters at each pixel 1 (1R, 1G and 1B), an image can be captured by giving priority to color reproducibility without lowering the resolution.

It is to be noted that the pixels 1R, 1G and 1B are disposed in a Bayer array in the embodiment, as explained earlier. Thus, as will be obvious from the earlier explanation, signals corresponding to the spectral sensitivity characteristics R[PDA], R[PDB], G[PDA] and G[PDB], (i.e., signals generated based upon the outputs from the first photodiodes PDA at pixels 1R, from the second photodiodes PDB at the pixels 1R, the first photodiode PDA at pixels 1G and from the second photodiodes PDB at the pixels 1G) are provided to the vertical signal line 5 serving a column in which pixels 1R and 1G are disposed in an alternating pattern (hereafter referred to as an "RG column"), with each signal delivered to the vertical signal line 5 with timing distinct from the timing with which the other signals are delivered in the first operation mode. In addition, in the first operation mode, signals corresponding to the spectral sensitivity characteristics G[PDA], G[PDB], B[PDA] and B[PDB] (i.e., signals generated based upon the outputs from the first photodiodes PDA at pixels 1G, from the second photodiodes PDB at pixels 1B, the first photodiodes PDA at pixels 1B and from the second photodiodes PDB at the pixels 1B) are provided to the vertical signal line 5 serving a column in which pixels 1G and 1B are disposed in an alternating pattern (hereafter referred to as a "GB column"), with each signal delivered to the vertical signal line 5 with timing distinct from the timing with which the other signals are delivered.

FIG. 9 presents a timing chart of the operation executed in the solid-state image sensor assuming a second operation mode in the embodiment. In the second operation mode, the signals from the first and second photodiodes at each pixel 1 are added together for a sum read.

At the beginning of a period T21 during the period T1 through which the pixels 1 in row n are selected, the reset transistors RES in row n are turned off. At the beginning of a period T22 during the period T21, the first and second transfer transistors TXA and TXB in row n are simultaneously turned on. The electrical charges from the first and second photodiodes PDA and PDB at the pixels 1 in row n are then transferred to the floating diffusions FD at the pixels 1 in row n all at once. As a result, the signal charges from the first and second photodiodes PDA and PDB are combined into a sum at the corresponding floating diffusion FD.

At the beginning of a period T22_1 preceding the period T22 during the period T21, ØTN is turned on and dark signals are stored into the dark signal storage capacitors CN. At the beginning of a period T222 following the period T22 during the period T21, ØTS is turned on and optical signals corresponding to electrical charges representing the sums of the signals from the first and second photodiodes PDA and PDB at the pixels 1 in row n are stored into the corresponding optical signal storage capacitors CS. Subsequently, ØH1 and ØH2 are sequentially set to high level at the beginning of a period T22_3 and at the beginning of a period T22_4 horizontal scanning is executed in response and signals corresponding to the differences between the optical signals and the dark signals are output to the outside through the differential output amplifier 8.

Operation similar to that executed during the period T1, through which the pixels 1 in row n are selected, are executed during the period T2 through which the pixels 1 in row n+1 are selected and during a period through which the pixels 1 in another row are selected.

Through the operation executed in the second operation mode described above, the signals from the first and second photodiodes PDA and PDB at each pixel 1 are added together and read out as a sum. This means that signals corresponding to the three different types of spectral sensitivity characteristics R[A+B], G[A+B] and B[A+B] in FIG. 7 are read out in the second operation mode. Thus, while the color reproducibility cannot be improved in the second operation mode, a higher SN ratio is assured compared to the first operation mode explained earlier, since the levels of the individual signals are raised to a relatively high level. Namely, an image can be captured by giving priority to the SN ratio in the second operation mode.

The vertical scanning circuit 2 in the embodiment outputs the various control signals described earlier so as to selectively execute operation in the first operation mode or the second operation mode in response to an operation mode selection signal OSW provided by an external device.

As a result, images can be captured in the embodiment either in the first operation mode by giving priority to the color reproducibility without lowering the resolution or in the second operation mode by giving priority to the SN ratio.

For instance, in response to the operation mode selection signal OSW provided by the external device, the first operation mode may be selected for a photographing operation executed at low sensitivity so as to give priority to the color reproducibility and the second operation mode may be selected for a photographing operation executed at high sensitivity so as to give priority to the SN ratio.

By selecting the operation mode as described above, better color reproducibility is assured for the photographing operation executed at low sensitivity, during which a large amount of light enters the image sensor and thus there is little likelihood of a poor SN ratio. In addition, a higher SN ratio can be assured for a photographing operation executed at high sensitivity during which only a small amount of light enters the image sensor, giving rise to the likelihood of a poor SN ratio. In other words, better color reproducibility can be assured for a photographing operation executed at low sensitivity while sustaining a high SN ratio for a photographing operation executed at high sensitivity.

During the photographing operation executed at low sensitivity, the electrical charges in the first and second photodiodes PDA and PDB are read out separately from each other. Thus, a higher level of signal voltage relative to a given charge quantity can be handled in conjunction with a floating diffusion FD with a smaller capacity, without allowing the signal voltage to become saturated. During the photographing operation executed at high sensitivity, on the other hand, the charge quantity is bound to be smaller. For this reason, a signal read out as the sum of the electrical charges at the first and second photodiodes PDA and PDB can be handled without allowing the signal voltage to become saturated. Thus, the SN ratio can be further improved by reducing the capacity of the floating diffusion FD while sustaining a required dynamic range.

It is to be noted that as the earlier explanation indicates, the solid-state image sensor in the embodiment includes M (M=6 in the embodiment) photodiodes having spectral sensitivity characteristics different from one another (the first and second photodiodes PDA and PDB at pixels 1R, the first and second photodiodes PDA and PDB at pixels 1G and the first and second photodiodes PDA and PDB at pixels 1B). The M photodiodes can be sorted into N groups (N=3 in the embodiment). The first group is made up with the first and second photodiodes PDA and PDB at the pixels 1R, the second group is made up with the first and second photodiodes PDA and PDB at the pixels 1G and the third group is made up with the first and second photodiodes PDA and PDB at the pixels 1B. As shown in FIG. 6, the first and second photodiodes PDA and PDB belonging to a given group demonstrate spectral sensitivity characteristics represented by curves shown next to each other.

The present invention is not limited to the example described above, as long as M is an integer equal to or greater than 4. In addition, N simply needs to be an integer equal to or greater than 1 but smaller than M. Furthermore, the quantity of photodiodes belonging to a given group does not need to be equal to the quantity of photodiodes belonging to another group. The photodiodes do not need to be grouped in units of pixels either. For instance, the present invention may be adopted in conjunction with pixels each equipped with a single photodiode, and in such a case, the photodiode of a given pixel and the photodiodes of another pixel may be paired up and assigned to a group. Moreover, it is not strictly necessary that a plurality of photodiodes in a group be aligned with each other along the direction in which light enters.

Second Embodiment

FIG. 10 presents a timing chart of the operation executed in the solid-state image sensor assuming a third operation mode in the second embodiment of the present invention.

The following explanation focuses on the feature of the second embodiment distinguishing it from the first embodiment. The following feature of the solid-state image sensor in the embodiment differentiates it from the solid-state image sensor achieved in the first embodiment. The vertical scanning circuit 2 in the first embodiment outputs the various control signals explained earlier so as to selectively execute operation in the first operation mode, as shown in FIG. 8, or in the second operation mode, as shown in FIG. 9, in response to an operation mode selection signal ØSW. In the second embodiment, the vertical scanning circuit 2 outputs the various control signals so as to selectively execute operation in the first operation mode, as shown in FIG. 8, or in the third operation mode, as shown in FIG. 10, in response to an operation mode selection signal ØSW.

As shown in FIG. 10, the reset transistors RES in row n are sustained in the OFF state in the third operation mode through a period T21 during the selection period T1, during which the pixels in a row n are selected, as has been explained in reference to FIG. 8. In addition, dark signal sampling (with ØTN set to high level), which is executed during the period T15_1 in FIG. 8, is not executed in the third operation mode. Similar control is executed during the periods through which the pixels in other rows are selected.

In the third operation mode shown in FIG. 10, the reset transistors RES at the pixels 1 in row n are sustained in the OFF state before the second transfer transistors TXB at the pixels 1 in row n are turned on. Thus, by the time the second transfer transistors TXB at the pixels 1 in row n are turned on, the signal charge transfer from the first photodiodes PDA at the pixels 1 in row n to the floating diffusions FD in row n will have already occurred through a period T14. During a period T15, the signal charges from the second photodiodes PDB at the pixels 1 in row n are transferred to the floating diffusions FD in row n. As a result, the signal charges from the first and second photodiodes PDA and PDB are combined and added together at the floating diffusions FD in row n.

The operation executed in the third operation mode thus differs from that executed in the first operation mode shown in FIG. 8, in that the differentiation signals are output to an external recipient through the differential output amplifier 8 following the period T15. The differentiation signals are each generated based upon the difference between the optical signal representing the sum of the outputs from the first and second photodiodes PDA and PDB in a pixel 1 in row n sampled immediately after a period T15 and the corresponding dark signal having been sampled immediately before the period T14.

However, the operation executed in the third operation mode is similar to that executed in the first operation mode shown in FIG. 8, in that following the period T14, the signals generated in correspondence to the differences between the optical signals from the first photodiodes PDA at the pixels 1 in row n sampled during the period T14_2 and a dark signals sampled during the period T14_1 are output through the differential output amplifier 8 to the external recipient.

Operations similar to that executed during the period T1, through which the pixels 1 in row n are selected, are executed during the period T2 through which the pixels 1 in row n+1 are selected and during a period through which the pixels 1 in another row are selected.

Through the operation executed in the third operation mode described above, the signals originating from the first photodiodes at the individual pixels 1 and signals representing the sums of the signals from the first and second photodiodes PDA and PDB at the pixels 1 are read out. This means that signals corresponding a total of six different types of spectral sensitivity characteristics, i.e., the three different types of spectral sensitivity characteristics R[PDA], G[PDA] and B[PDA] in FIG. 6 and the three different types of spectral sensitivity characteristics R[A+B], G[A+B] and B[A+B] in FIG. 7, are read out in the third operation mode. This means that through the operation executed in the third operation mode, signals corresponding to the three different types of spectral sensitivity characteristics in FIG. 6, i.e., R[PDA], G[PDA] and B[PDA] obtained in the first operation mode, are generated in addition to the signals corresponding to the three different types of spectral sensitivity characteristics in FIG. 7, i.e., R[A+B], G[A+B] and B[A+B] achieving a high signal level which are obtained in the second operation mode, as described earlier. As a result, the color reproducibility can be significantly improved while sustaining a high SN ratio comparable to that achieved in the second operation mode. Namely, images can be captured by giving priority to the SN ratio while improving the color reproducibility to a certain extent as well through the third operation mode.

The embodiment described above enables selective execution of image capturing operation so as to capture images by giving priority to the color reproducibility in the first operation mode or capture images by giving priority to the SN ratio in the third operation mode. For instance, in response to the operation mode selection signal ØSW provided by an external device, the first operation mode may be selected for a photographing operation executed at low sensitivity so as to give priority to the color reproducibility and the third operation mode may be selected for a photographing operation executed at high sensitivity so as to give priority to the SN ratio. Advantages similar to those of the first embodiment are also achieved through this embodiment.

It is to be noted that the vertical scanning circuit 2 according to the present invention may output the various control signals described earlier so as to selectively execute operation in any of the first through third operation modes in response to an operation mode selection signal ØSW provided by an external device.

Third Embodiment

The following feature of the solid-state image sensor achieved in the third embodiment of the present invention differentiates it from the solid-state image sensor in the first embodiment. In the solid-state image sensor in the first embodiment, two conditions, i.e., a first condition whereby a uniform depth da is assumed for the charge storage layers 33 of all the pixels 1 (1R, 1G and 1B) and a second condition whereby a uniform depth db is assumed for the charge storage layers 34 at all pixels 1 (1R, 1G and 1B) are both satisfied. In contrast, the depths da and db at the individual pixels 1 (1R, 1G and 1B) are set by ensuring that at least either the first condition or the second condition is not satisfied in this embodiment. In other words, the third embodiment differs from the first embodiment in that the depths da and db are set so as to satisfy requirements (1) and (2) below.

(1) Better uniformity is achieved with respect to the intervals between the peaks PBA, PBB, PGA, PGB, PRA and PRB of the waveforms representing the spectral sensitivity characteristics B[PDA], B[PDB], G[PDA], G[PDB], R[PDA] and R[PDB].

(2) Better uniformity is achieved with regard to the profiles (areas) of the curves representing the spectral sensitivity characteristics B[PDA], B[PDB], G[PDA], G[PDB], R[PDA] and R[PDB].

Figure 11:
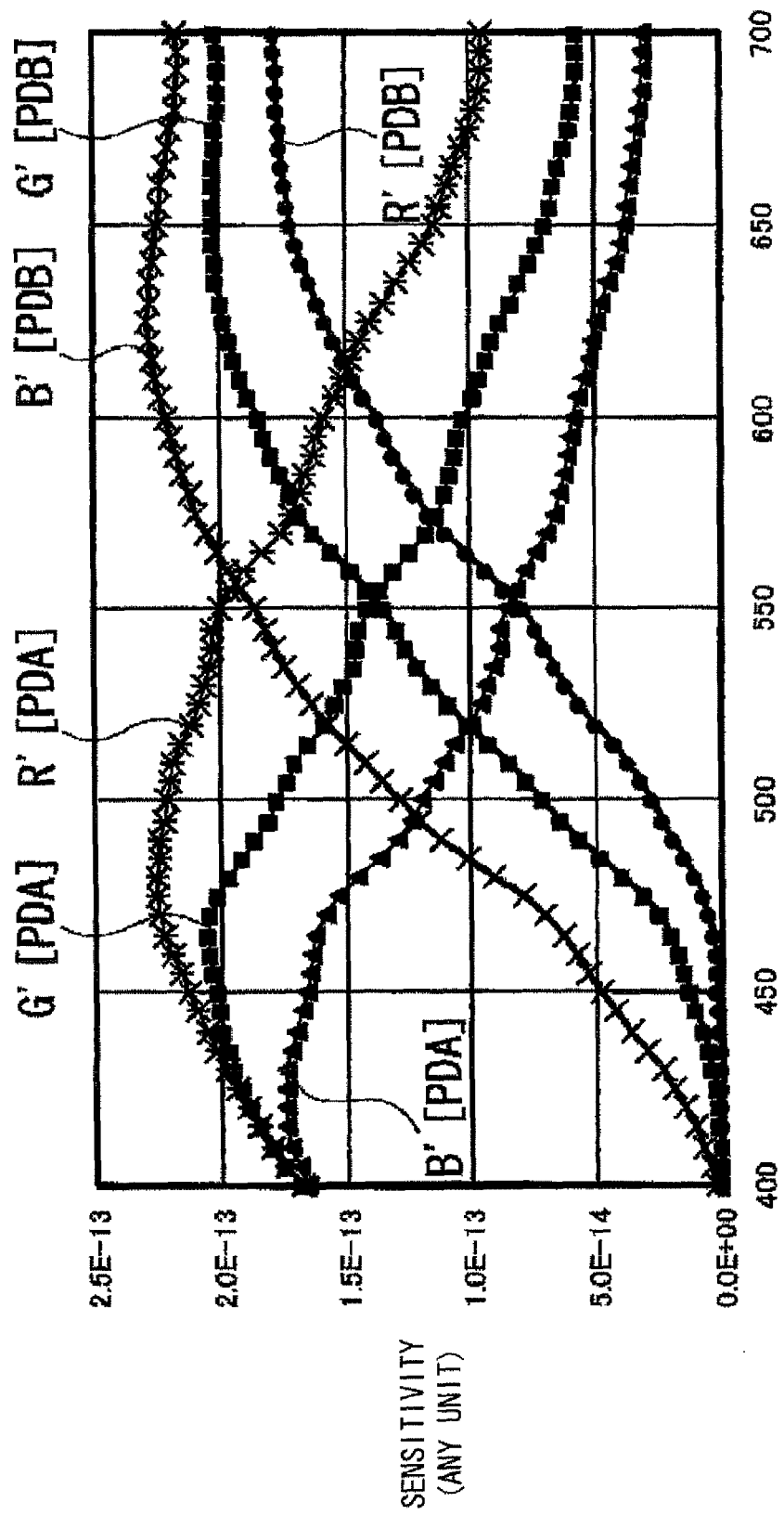
FIG. 11 presents another example of results that may be obtained by simulating the initial spectral sensitivity characteristics of the first and second photodiodes in individual pixels.

FIG. 11 presents another example of results that may be obtained by simulating the initial spectral sensitivity characteristics (i.e., spectral sensitivity characteristics that may be observed before disposing the color filters 37) at the first and second photodiodes PDA and PDB at various pixels 1R, 1G and 1B. In FIG. 11, B'[PDA] denotes the initial spectral sensitivity characteristics of the first photodiode PDA at a pixel 1B, B'[PDB] denotes the initial spectral sensitivity characteristics of the second photodiode PDB at the pixel 1B, G'[PDA] denotes the initial spectral sensitivity characteristics of the first photodiode PDA at the pixel 1G, G'[PDB] denotes the initial spectral sensitivity characteristics of the second photodiode PDB at the pixel 1G, R'[PDA] denotes the initial spectral sensitivity characteristics of the first photodiode PDA at the pixel 1R, R'[PDB] denotes the initial spectral sensitivity characteristics of the second photodiode PDB at the pixel 1R.

The spectral sensitivity characteristics are simulated with depths da and db set as follows. Namely, the depth da of the charge storage layer 33 constituting the first photodiode PDA in the pixel 1B is set to 0.2 pin and the depth db of the charge storage layer 34 constituting the second photodiode PDB in the pixel 1B is set to 0.9 μm. The depth da of the charge storage layer 33 constituting the first photodiode PDA in the pixel 1G is set to 0.3 μm and the depth db of the charge storage layer 34 constituting the second photodiode PDB in the pixel 1G is set to 1.3 μm. The depth da of the charge storage layer 33 constituting the first photodiode PDA in the pixel 1R is set to 0.5 μm and the depth db of the charge storage layer 34 constituting the second photodiode PDB in the pixel 1R is set to 2.2 μm.

Figure 12:
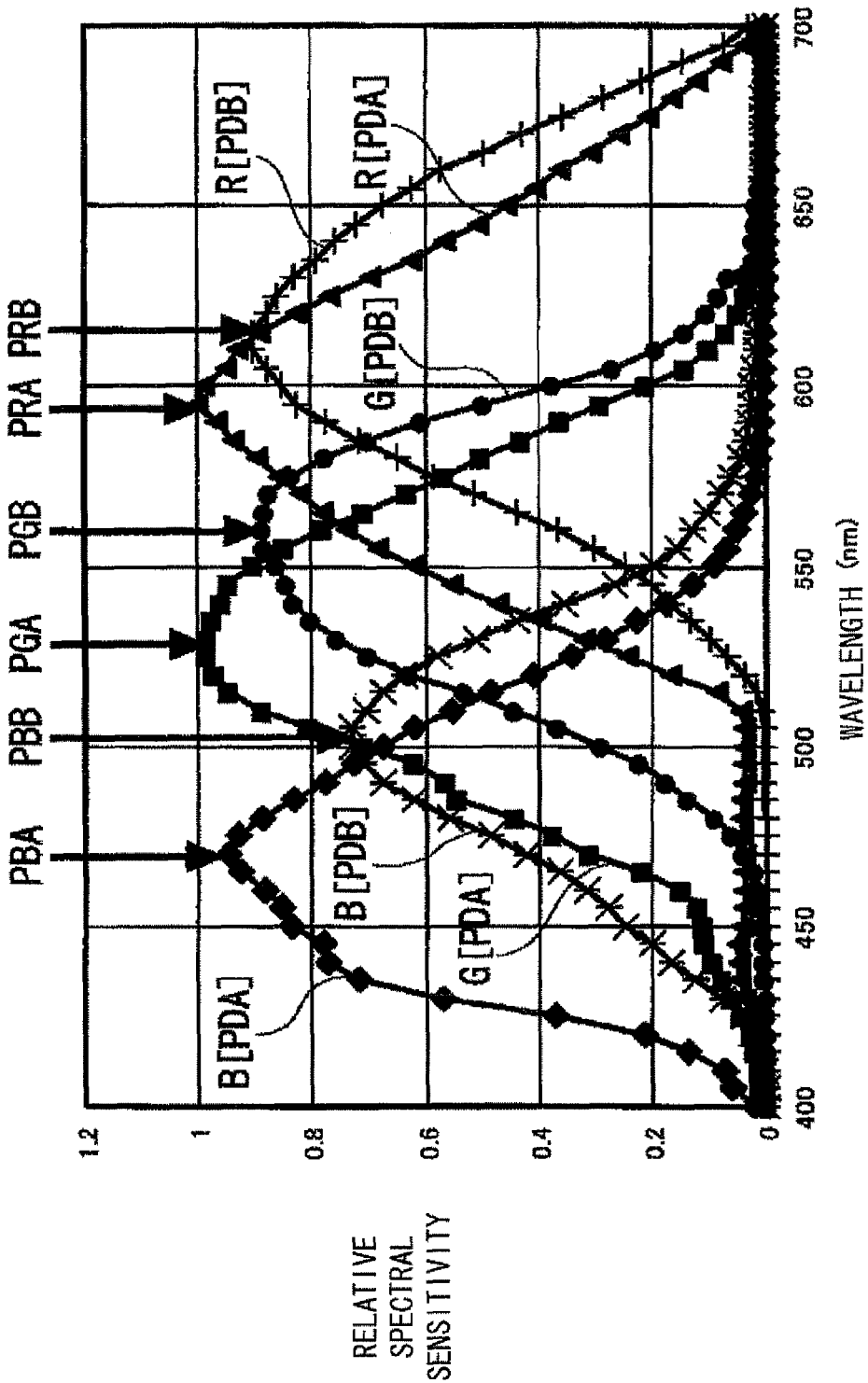
FIG. 12 presents another example of spectral sensitivity characteristics of the first and second photodiodes that may be observed in individual pixels.

FIG. 12, which is similar to FIG. 6, indicates the spectral sensitivity characteristics of the first and second photodiodes PDA and PDB at the various pixels 1R, 1G and 1B with the spectral transmittance characteristics of the IR cut filters factored in. It is assumed that the initial spectral sensitivity characteristics of the first and second photodiodes PDA and PDB at the individual pixels 1R, 1G and 1B are similar to those shown in FIG. 11. In addition, the meanings of the reference codes in FIG. 12 are identical to those of the reference codes in FIG. 6.

FIG. 12 shows the peaks PBA, PBB, PGA, PGB, PRA and PRB of the waveforms representing the spectral sensitivity characteristics B[PDA], B[PDB], G[PDA], G[PDB], R[PDA] and R[PDB] over intervals that are relatively uniform compared to the intervals between the peaks in FIG. 11. In addition, FIG. 12 shows the profiles (areas) of the curves representing the spectral sensitivity characteristics B[PDA], B[PDB], G[PDA], G[PDB], R[PDA] and R[PDB] achieving better uniformity.

Accordingly, it is desirable to set the depths da and db as described below in the embodiment by taking into consideration manufacturing errors including an error when implanting ions to form the charge storage layers 33 and 34 and an error that may occur during thermal diffusion. Namely, the depth da and the depth db should be set within a range of 0.1 μm to 0.3 μm and within a range of 0.8 μm to 1.0 μm for the pixel 1B, the depth da and the depth db should be set within a range of 0.2 μm to 0.4 μm and within a range of 1.2 μm to 1.4 μm for the pixel 1G and the depth da and the depth db should be set within a range of 0.4 μm to 0.6 μm and within a range of 0.4 μm to 0.6 μm for the pixel 1R. However, it is not strictly necessary that the depth da and db at the pixels 1R, 1G and 1B be set exactly within these ranges.

Advantages similar to those of the first embodiment are also achieved through this embodiment. In addition, better uniformity is achieved with regard to the intervals between the peaks PBA, PBB, PGA, PGB, PRA and PRS of the waveforms representing the spectral sensitivity characteristics B[PDA], B[PDB], G[PDA], G[PDB], R[PDA] and R[PDB], compared to the peak intervals observed in the first embodiment. As a result, a further improvement in color reproducibility is achieved. Furthermore, through this embodiment, better uniformity is achieved with regard to the profiles (areas) of the curves representing the spectral sensitivity characteristics B[PDA], B[PDB], G[PDA], G[PDB], R[PDA] and R[PDB], compared to those observed in the first embodiment, and thus, inconsistency among the largest charge quantities generated at the photodiodes corresponding to the various colors is reduced. This means that since the need for applying a gain in signal processing executed at a subsequent stage is eliminated, a higher SN ratio is achieved through the embodiment, in comparison to the first embodiment. It is to be noted that a modification similar to that adopted in conjunction with the first embodiment to achieve this embodiment may also be adopted in conjunction with the second embodiment.

Fourth Embodiment

Figure 13:
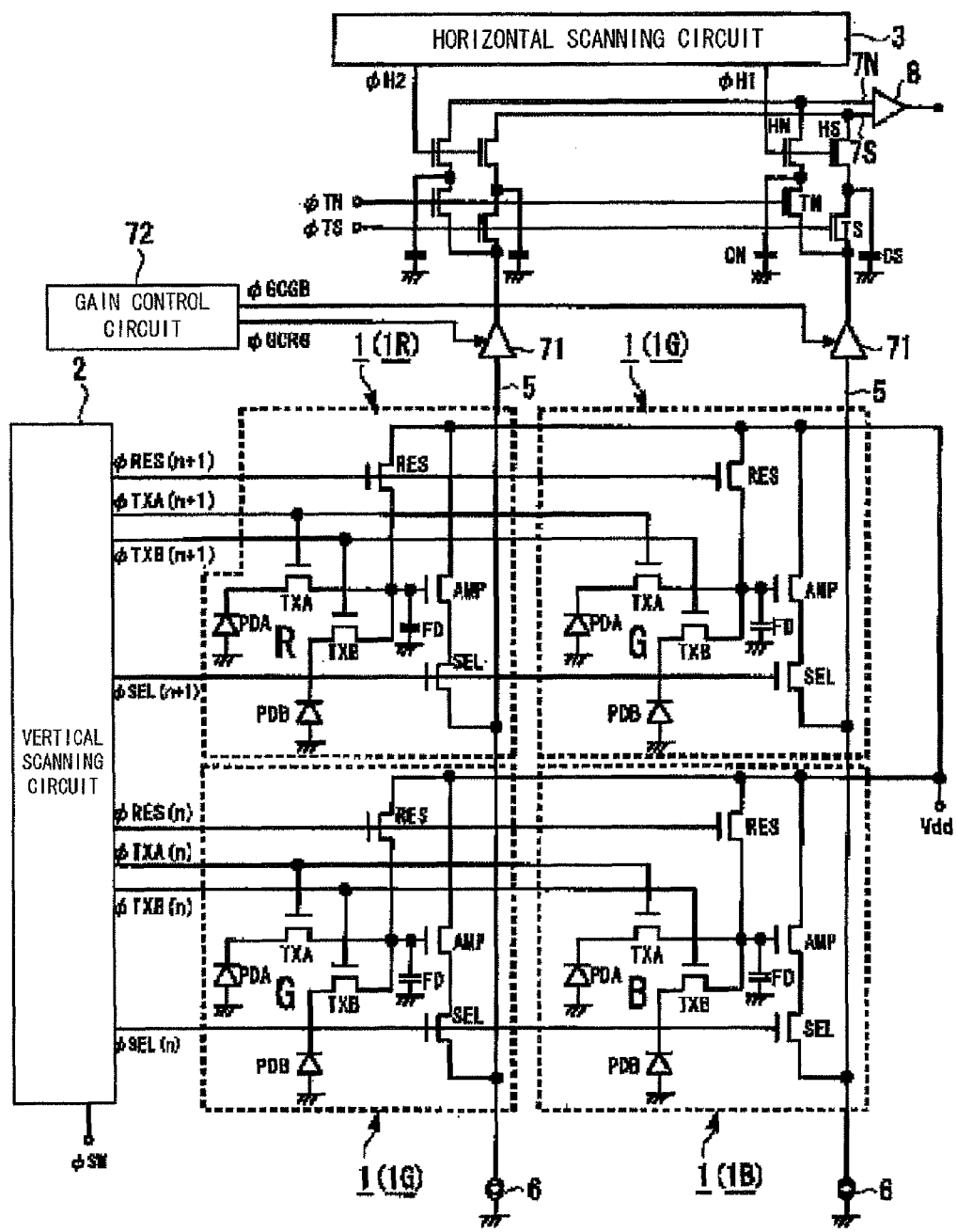
FIG. 13 is a circuit diagram schematically illustrating the structure of the solid-state image sensor achieved in a fourth embodiment of the present invention.

FIG. 13 is a circuit diagram schematically showing the structure of the solid-state image sensor achieved in the fourth embodiment of the present invention. In FIG. 13, the same reference numerals are assigned to elements identical to those in FIG. 1 and a repeated explanation is not provided.

The following features of the solid-state image sensor achieved in the embodiment differentiate it from the solid-state image sensor in the first embodiment. The solid-state image sensor in the embodiment further includes a variable gain amplifier 71, disposed between each vertical signal line 5 and the corresponding optical signal vertical transfer transistor TS and dark signal vertical transfer transistor TN, which amplifies the signals in the vertical signal line 5 by functioning as a column amplifier. In addition, the solid-state image sensor in the embodiment includes a gain control circuit 72 functioning as a gain control unit that controls the gain at each variable gain amplifier 71.

In the embodiment, the vertical signal line 5 is directly connected to an input portion of the variable gain amplifier 71, enabling the variable gain amplifier 71 to amplify the signals in the vertical signal line 5. As an alternative, a signal processing circuit (e.g., a preamplifier) may be disposed between the input portion of the variable gain amplifier 71 and the vertical signal line 5 so as to amplify via the variable gain amplifier 71 signals corresponding to the signals in the vertical signal line 5.

The gain control circuit 72 sets the highest levels of the amplified signals as close to one another as possible by controlling the gain at each variable gain amplifier 71 in correspondence to the spectral sensitivity characteristics of the photoelectric conversion units corresponding to the signals amplified by the variable gain amplifier 71. In the embodiment, achieved in conjunction with pixels disposed in a Bayer array, a signal output from a pixel 1 belonging to an RG column and a signal output from a pixel 1 belonging to another RG column in a given row carry same-color information and likewise, a signal output from a pixel 1 belonging to a GB column and a signal output from a pixel 1 belonging to another GB column in a given row carry same-color information. However, a signal output from a pixel 1 belonging to an RG column and a pixel output from a pixel 1 belonging to a GB column in the same row will carry color information corresponding to different colors. For this reason, the gain control circuit 72 in the embodiment executes control so that the variable gain amplifier 71 serving an RG column and the variable gain amplifier 71 serving a GB column amplify signals by applying different gains. Namely, the gain control circuit 72 provides a gain control signal ØGCRG to the variable gain amplifier 71 for the RG column and provides a gain control signal ØGCGB, generated independently of the gain control signal ØGCRG to the variable gain amplifier 71 for the GB column. It is to be noted that the gain control circuit 72 may provide the same gain control signal ØGCRG simultaneously to the variable gain amplifiers 72 corresponding to all the RG columns and provide the same gain control signal ØGCGB simultaneously to the variable gain amplifiers 71 corresponding to all the GB columns.

The variable gain amplifiers 71 and the gain control circuit 72 in the embodiment fulfill a function of individually amplifying signals generated based upon the outputs from the first and second photodiodes PDA and PDB at pixels 1R, 1G and 1B by applying different gains to the individual signals.

In more specific terms, the gain control circuit 72 achieved in the embodiment provides the gain control signals ØGCRG and ØGCGB as described below in the first operation mode explained earlier in reference to FIG. 8. Namely, the gain control circuit 72 supplies the gain control signal ØGCRG and the gain control signal ØGCGB during the period T11 (at least through the signal sampling periods (i.e., the ØTN high-level period T14_1 and the ØTS high-level period T14_2 during the period T11) this concept also applies to the operations executed during the periods T13, T31 and T33 to be described later). The gain control signal ØGCRG is a control signal used to control the gain for the variable gain amplifiers 71 serving the RG columns in correspondence to the spectral sensitivity characteristics R[PDA] so that the amplified signals achieve a highest signal level close to a predetermined level. In addition, the gain control signal ØGCGB is a control signal used to control the gain for the variable gain amplifiers 71 serving the GB columns in correspondence to the spectral sensitivity characteristics G[PDA] so that the amplified signals achieve a highest signal level close to a predetermined level.

The gain control circuit 72 supplies the gain control signal ØGCRG and the gain control signal ØGCGB during the period T13. The gain control signal ØGCRG is a control signal used to control the gain for the variable gain amplifiers 71 serving the RG columns in correspondence to the spectral sensitivity characteristics R[PDB] so that the amplified signals achieve a highest signal level close to a predetermined level. The gain control signal ØGCGB is a control signal used to control the gain for the variable gain amplifiers 71 serving the GB columns in correspondence to the spectral sensitivity characteristics G[PDB] so that the amplified signals achieve a highest signal level close to a predetermined level.

The gain control circuit 72 supplies the gain control signal ØGCRG and the gain control signal ØGCGB during the period T31. The gain control signal ØGCRG is a control signal used to control the gain for the variable gain amplifiers 71 serving the RG columns in correspondence to the spectral sensitivity characteristics G[PDA] so that the amplified signals achieve a highest signal level close to a predetermined level. The gain control signal ØGCGB is a control signal used to control the gain for the variable gain amplifiers 71 serving the GB columns in correspondence to the spectral sensitivity characteristics B[PDA] so that the amplified signals achieve a highest signal level close to a predetermined level.

The gain control circuit 72 supplies the gain control signal ØGCRG and the gain control signal ØGCGB during the period T33. The gain control signal ØGCRG is a control signal used to control the gain for the variable gain amplifiers 71 serving the RG columns in correspondence to the spectral sensitivity characteristics G[PDB] so that the amplified signals achieve a highest signal level close to a predetermined level. The gain control signal ØGCGB is a control signal used to control the gain for the variable gain amplifiers 71 serving the GB columns in correspondence to the spectral sensitivity characteristics B[PDB] so that the amplified signals achieve a highest signal level close to a predetermined level.

It is to be noted that the gain control circuit 72 in the embodiment may execute control in the second operation mode by sustaining the gains at all the variable gain amplifiers 71 at the same value at all times or by switching the gain at each variable gain amplifier 71 to a different value with optimal timing.

Advantages similar to those of the first embodiment are also achieved through the embodiment described above. In addition, even if there are discrepancies among the highest levels of charge achieved in the photodiodes corresponding to different colors, the differences among the highest signal levels achieved by the various color signals having been amplified via the variable gain amplifiers 71 can be minimized in the embodiment. Thus, since the need for executing gain application in subsequent signal processing is eliminated, a higher SN ratio, compared to that achieved in the first embodiment, can be assured in this embodiment.

It is to be noted that a modification similar to that adopted in conjunction with the first embodiment to achieve this embodiment may also be adopted in conjunction with the second or third embodiment. In the second embodiment modified in this manner, control may be executed in the third operation mode by sustaining the gains for all the variable gain amplifiers 71 at a uniform value at all times or by switching the gain at each variable gain amplifier 71 to a different value with optimal timing.

The embodiments described above simply represent examples and the present invention is in no way limited to these examples as long as the functions characterizing the present invention remain intact.

For instance, the spectral characteristics of the individual photodiodes are altered in the embodiments by assuming different colors at the color filters 37 and by setting the charge storage layers constituting the photodiodes to specific depths. However, varying spectral characteristics may be achieved either by assuming different colors for the color filters or by setting the charge storage layers to specific depths. For instance, four different types of photodiodes demonstrating first through fourth spectral sensitivity characteristics may be obtained by disposing the charge storage layers constituting the individual photodiodes at different planar positions but at the same depth and disposing color filters assuming first through fourth colors on the light-entry side of the individual photodiodes.

In addition, in the embodiments described above, a set of transistors made up with an amplifier transistor AMP, a reset transistor RES and a selector transistor SEL is disposed to serve both the first and second photodiodes PDA and PDB at each pixel 1. However, the present invention is not limited to this example and each pixel 1 may include a set of transistors exclusively serving the first photodiode PDA and another set of transistors exclusively serving the second photodiode PDB.

The above described embodiments are examples, and various modifications can be made without departing from the scope of the invention.

What is claimed is:

1. A solid-state image sensor, comprising:
four or more photoelectric conversion units having spectral sensitivity characteristics different from one another, at least two of the photoelectric conversion units disposed at different depths in a substrate, the at least two photoelectric conversion units at least partially overlapping in a direction perpendicular to a surface of the substrate; and
color filters having spectral transmittance characteristics different from one another, each of which is in correspondence to one of N (N represents an integer less than a quantity of the four or more photoelectric conversion units and equal to or greater than three) groups of photoelectric conversion units, a plurality of photoelectric conversion units among the four or more photoelectric conversion units belonging to each of the N groups, wherein:
the color filters are disposed on a light-entry side of the plurality of photoelectric conversion units belonging to each specific group;
charge storage layers each constituting one of the plurality of photoelectric conversion units belonging to the specific group are disposed in alignment with one another along a direction in which light enters;
the quantity of the four or more photoelectric conversion units is six, N is equal to three and a quantity of photoelectric conversion units belonging to each group is two;
the three groups each include a first photoelectric conversion unit with a charge storage layer thereof disposed on a light-entry side and a second photoelectric conversion unit with a charge storage layer thereof disposed on a side opposite from the light-entry side;
the three first photoelectric conversion units in the three groups are formed so as to satisfy a first condition and the three second photoelectric conversion units in the three groups are formed so as to satisfy a second condition; and
the first condition stipulates that the charge storage layers each constituting one of the three first photoelectric conversion units assume positions with a uniform depth measured from a semiconductor surface on the light-entry side and the second condition stipulates that the charge storage layers each constituting one of the three second photoelectric conversion units assume positions with a uniform depth measured from the semiconductor surface on the light-entry side.

2. A solid-state image sensor comprising:
four or more photoelectric conversion units having spectral sensitivity characteristics different from one another, at least two of the photoelectric conversion units disposed at different depths in a substrate, the at least two photoelectric conversion units at least partially overlapping in a direction perpendicular to a surface of the substrate;

an amplifier unit disposed in correspondence to each group of photoelectric conversion units among N groups (N represents an integer less than a quantity of the four or more photoelectric conversion units and equal to or greater than one), the four or more photoelectric conversion units being divided into the N groups; and transfer units, each disposed in correspondence to one of the four or more photoelectric conversion units, which transfer a signal generated at the photoelectric conversion unit to the amplifier unit disposed for the group to which the photoelectric conversion unit belongs, wherein:

the quantity of the four or more photoelectric conversion units is six, N is equal to three and a quantity of photoelectric conversion units belonging to each group is two;

the three groups each include a first photoelectric conversion unit with a charge storage layer thereof disposed on a light-entry side and a second photoelectric conversion unit with a charge storage layer thereof disposed on a side opposite from the light-entry side;

the three first photoelectric conversion units in the three groups are formed so as to satisfy a first condition and the three second photoelectric conversion units in the three groups are formed so as to satisfy a second condition; and the first condition stipulates that the charge storage layers each constituting one of the three first photoelectric conversion units assume positions with a uniform depth measured from a semiconductor surface on the light-entry side and the second condition stipulates that the charge storage layers each constituting one of the three second photoelectric conversion units assume positions with a uniform depth measured from the semiconductor surface on the light-entry side.

3. A solid-state image sensor comprising:

four or more photoelectric conversion units having spectral sensitivity characteristics different from one another, at least two of the photoelectric conversion units disposed at different depths in a substrate, the at least two photoelectric conversion units at least partially overlapping in a direction perpendicular to a surface of the substrate;

an amplifier unit disposed in correspondence to each group of photoelectric conversion units among N groups (N represents an integer less than a quantity of the four or more photoelectric conversion units and equal to or greater than one), the four or more photoelectric conversion units being divided into the N groups; and transfer units, each disposed in correspondence to one of the four or more photoelectric conversion units, which transfer a signal generated at the photoelectric conversion unit to the amplifier unit disposed for the group to which the photoelectric conversion unit belongs, wherein:

the quantity of the four or more photoelectric conversion units is six, N is equal to three and a quantity of photoelectric conversion units belonging to each group is two;

the three groups each include a first photoelectric conversion unit with a charge storage layer thereof disposed on a light-entry side and a second photoelectric conversion unit with a charge storage layer thereof disposed on a side opposite from the light-entry side;

the three first photoelectric conversion units in the three groups and the three second photoelectric conversion units in the three groups are formed so that at least one of a first condition and a second condition is not satisfied; and the first condition stipulates that the charge storage layers each constituting one of the three first photoelectric conversion units assume positions with a uniform depth measured from a semiconductor surface on the light-entry side and the second condition stipulates that the charge storage layers each constituting one of the three second photoelectric conversion units assume positions with a uniform depth measured from the semiconductor surface on the light-entry side.

4. A solid-state image sensor comprising:

four or more photoelectric conversion units having spectral sensitivity characteristics different from one another, at least two of the photoelectric conversion units disposed at different depths in a substrate, the at least two photoelectric conversion units at least partially overlapping in a direction perpendicular to a surface of the substrate; and color filters having spectral transmittance characteristics different from one another, each of which is in correspondence to one of N (N represents an integer less than a quantity of the four or more photoelectric conversion units and equal to or greater than three) groups of photoelectric conversion units, a plurality of photoelectric conversion units among the four or more photoelectric conversion units belonging to each of the N groups, wherein:

the color filters are disposed on a light-entry side of the plurality of photoelectric conversion units belonging to each specific group;

charge storage layers each constituting one of the plurality of photoelectric conversion units belonging to the specific group are disposed in alignment with one another along a direction in which light enters;

the quantity of the four or more photoelectric conversion units is six, N is equal to three and a quantity of photoelectric conversion units belonging to each group is two;

the three groups each include a first photoelectric conversion unit with a charge storage layer thereof disposed on a light-entry side and a second photoelectric conversion unit with a charge storage layer thereof disposed on a side opposite from the light-entry side;

the three first photoelectric conversion units in the three groups and the three second photoelectric conversion units in the three groups are formed so that at least one of a first condition and a second condition is not satisfied; and the first condition stipulates that the charge storage layers each constituting one of the three first photoelectric conversion units assume positions with a uniform depth measured from a semiconductor surface on the light-entry side and the second condition stipulates that the charge storage layers each constituting one of the three second photoelectric conversion units assume positions with a uniform depth measured from the semiconductor surface on the light-entry side.

5. A solid-state image sensor having a plurality of pixels in three pixels having at least three distinct characteristics different from one another, the solid-state image sensor comprising:

two photoelectric conversion units disposed at each of the three pixels and that perform photoelectric conversion of light having spectral characteristics that are different from each other, the two photoelectric conversion units each disposed at a different depth in a substrate, the two photoelectric conversion units at least partially overlapping in a direction perpendicular to a surface of the substrate;

an amplifier unit disposed in correspondence to each of the pixels; and a control unit that selects an operation at the photoelectric conversion units in a first operation mode or a second operation mode; wherein:

in the first operation mode, a first signal generated in one of the photoelectric conversion unit disposed at a single pixel and a second signal generated in another photoelectric conversion unit disposed at the single pixel are separately output from the amplifier unit; and in the second operation mode, a third signal corresponding to a sum of the first signal and the second signal is output from the amplifier unit.

6. A solid-state image sensor having a plurality of pixels in three pixels having at least three distinct characteristics different from one another, the solid-state image sensor comprising:

two photoelectric conversion units disposed at each of the three pixels and that perform photoelectric conversion of light having spectral characteristics that are different from each other, the two photoelectric conversion units each disposed at a different depth in a substrate, the two photoelectric conversion units at least partially overlapping in a direction perpendicular to a surface of the substrate;

an amplifier unit disposed in correspondence to of the pixels; and a control unit that selects an operation at the photoelectric conversion units in a first operation mode or a second operation mode; wherein in the first operation mode, a first signal generated in one of the photoelectric conversion unit disposed at a single pixel and a second signal generated in another photoelectric conversion unit disposed at the single pixel are separately output from the amplifier unit; and in the second operation mode, the first signal or the second signal is output from the amplifier unit and a third signal corresponding to a sum of the first signal and the second signal is output from the amplifier unit.

7. A solid-state image sensor having a plurality of pixels in three pixels having at least three distinct characteristics different from one another, the solid-state image sensor comprising:

two photoelectric conversion units disposed at each of the three pixels and that perform photoelectric conversion of light having spectral characteristics that are different from each other, the two photoelectric conversion units each disposed at a different depth in a substrate, the two photoelectric conversion units at least partially overlapping in a direction perpendicular to a surface of the substrate; and an amplifier unit disposed in correspondence to of the pixels, wherein:

three first photoelectric conversion units disposed at a light-entry side of the substrates in the three pixels are formed so as to satisfy a first condition and three second photoelectric conversion units disposed at an opposite side of the substrates in the three pixels are formed so as to satisfy a second condition; and the first condition stipulates that the three first photoelectric conversion units are disposed at positions with a uniform depth and the second condition stipulates that the three second photoelectric conversion units are disposed at positions with a uniform depth.

8. A solid-state image sensor having a plurality of pixels in three pixels having at least three distinct characteristics different from one another, the solid-state image sensor comprising:

two photoelectric conversion units disposed at each of the three pixels and that perform photoelectric conversion of light having spectral characteristics that are different from each other, the two photoelectric conversion units each disposed at a different depth in a substrate, the two photoelectric conversion units at least partially overlapping in a direction perpendicular to a surface of the substrate; and an amplifier unit disposed in correspondence to of the pixels, wherein:

three first photoelectric conversion units disposed at a light-entry side of the substrates in the three pixels and three second photoelectric conversion units disposed at an opposite side of the substrates in the three pixels are formed so that at least one of a first condition and a second condition is not satisfied; and the first condition stipulates that the three first photoelectric conversion units are disposed at positions with a uniform depth and the second condition stipulates that the three second photoelectric conversion units are disposed at positions with a uniform depth.

9. A solid-state image sensor having a plurality of pixels in three pixels having at least three distinct characteristics different from one another, the solid-state image sensor comprising:

two photoelectric conversion units disposed at each of the three pixels and that perform photoelectric conversion of light having spectral characteristics that are different from each other, the two photoelectric conversion units each disposed at a different depth in a substrate, the two photoelectric conversion units at least partially overlapping in a direction perpendicular to a surface of the substrate; and color filters disposed on a light-entry side of the plurality of photoelectric conversion units belonging to each pixel, wherein:

each of three color filters disposed in correspondence to each of three pixels have spectral transmittance characteristics different from one another;

three first photoelectric conversion units disposed at the light-entry side of the substrates in the three pixels are formed so as to satisfy a first condition and three) second photoelectric conversion units disposed at an opposite side of the substrates in the three pixels are formed so as to satisfy a second condition; and the first condition stipulates that the three first photoelectric conversion units are disposed at positions with a uniform depth and the second condition stipulates that the three second photoelectric conversion units are disposed at positions with a uniform depth.

10. A solid-state image sensor having a plurality of pixels in three pixels having at least three distinct characteristics different from one another, the solid-state image sensor comprising:

two photoelectric conversion units disposed at each of the three pixels and that perform photoelectric conversion of light having spectral characteristics that are different from each other, the two photoelectric conversion units each disposed at a different depth in a substrate, the two photoelectric conversion units at least partially overlapping in a direction perpendicular to a surface of the substrate; and color filters disposed on a light-entry side of the plurality of photoelectric conversion units belonging to each pixel, wherein:

each of three color filters disposed in correspondence to each of three pixels have spectral transmittance characteristics different from one another;

three first photoelectric conversion units disposed at the light-entry side of the substrates in the three pixels and the three second photoelectric conversion units disposed at an opposite side of the substrates in the three pixels are formed so that at least one of a first condition and a second condition is not satisfied; and the first condition stipulates that the three first photoelectric conversion units are disposed at positions with a uniform depth and the second condition stipulates that the three second photoelectric conversion units are disposed at positions with a uniform depth.

* * * * *